United States Patent
Takashima et al.

(10) Patent No.: US 11,937,400 B2
(45) Date of Patent: Mar. 19, 2024

(54) HEAT DISSIPATION DEVICE AND COOLING UNIT

(71) Applicant: Nidec Corporation, Kyoto (JP)

(72) Inventors: Naoyuki Takashima, Kyoto (JP);
Takehito Tamaoka, Kyoto (JP);
Toshihiko Tokeshi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 134 days.

(21) Appl. No.: 17/684,561

(22) Filed: Mar. 2, 2022

(65) Prior Publication Data

US 2022/0287204 A1    Sep. 8, 2022

(30) Foreign Application Priority Data

Mar. 4, 2021  (JP) ................... 2021-034647
Jan. 14, 2022 (JP) ................... 2022-004418

(51) Int. Cl.
*H05K 7/20* (2006.01)
*H01L 23/473* (2006.01)

(52) U.S. Cl.
CPC ..... *H05K 7/20272* (2013.01); *H05K 7/20263* (2013.01); *H01L 23/473* (2013.01); *H05K 7/20254* (2013.01)

(58) Field of Classification Search
CPC .. H05K 7/20; H05K 7/20127; H05K 7/20154; H05K 7/20218; H05K 7/20254; H05K 7/20263; H05K 7/20272; H05K 7/20772; H05K 7/2039; H05K 7/2089; H05K 7/209; H05K 7/20927; H05K 1/02–0203; H05K 1/021; H01L 23/3672; H01L 23/46; H01L 23/473; G06F 1/20
See application file for complete search history.

(56) References Cited

U.S. PATENT DOCUMENTS

| | | | |
|---|---|---|---|
| 2003/0200762 A1 | 10/2003 | Nakano et al. | |
| 2019/0206765 A1* | 7/2019 | Qu | ........... H01L 23/473 |
| 2021/0360825 A1* | 11/2021 | Wu | ........ H05K 7/20263 |
| 2022/0071058 A1* | 3/2022 | Chen | ............... F28F 9/18 |

* cited by examiner

*Primary Examiner* — Zachary Pape
*Assistant Examiner* — Steven Ngo
(74) *Attorney, Agent, or Firm* — Keating & Bennett, LLP

(57) ABSTRACT

A heat dissipation device includes a first heat dissipator, a second heat dissipator, a first tank connected to one side of each of the first heat dissipator and the second heat dissipator in a first direction, and a second tank connected to another side in the first direction. A coolant flows through an inside of the first heat dissipator, the second heat dissipator, the first tank, and the second tank. The first tank includes a tank-side first outflow port through which the coolant flows out to a first cooling device, and a tank-side first inflow port through which the coolant from the first cooling device flows in. The second tank includes a tank-side second outflow port through which the coolant flows out to a second cooling device, and a tank-side second inflow port through which the coolant from the second cooling device flows in.

16 Claims, 15 Drawing Sheets

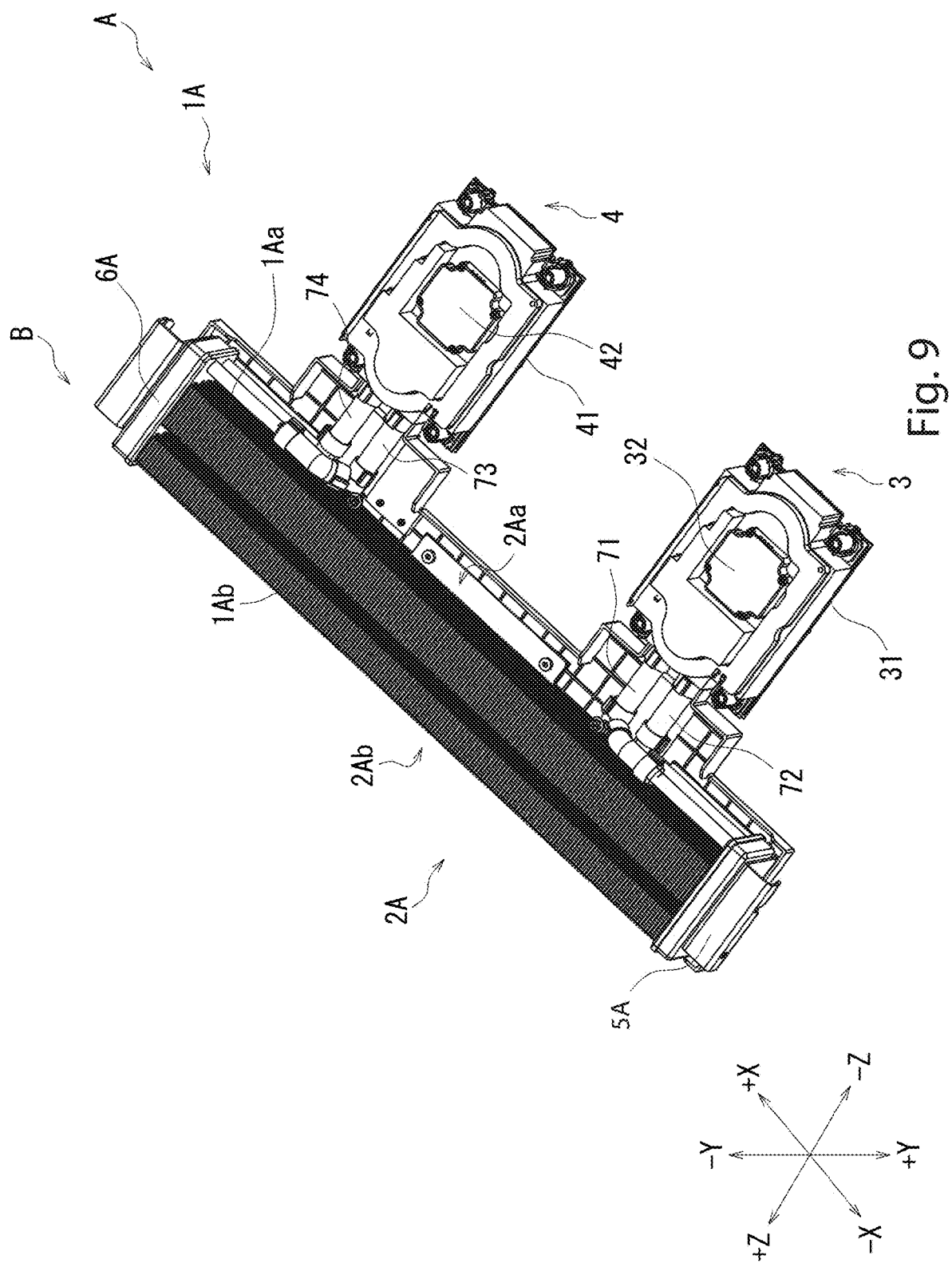

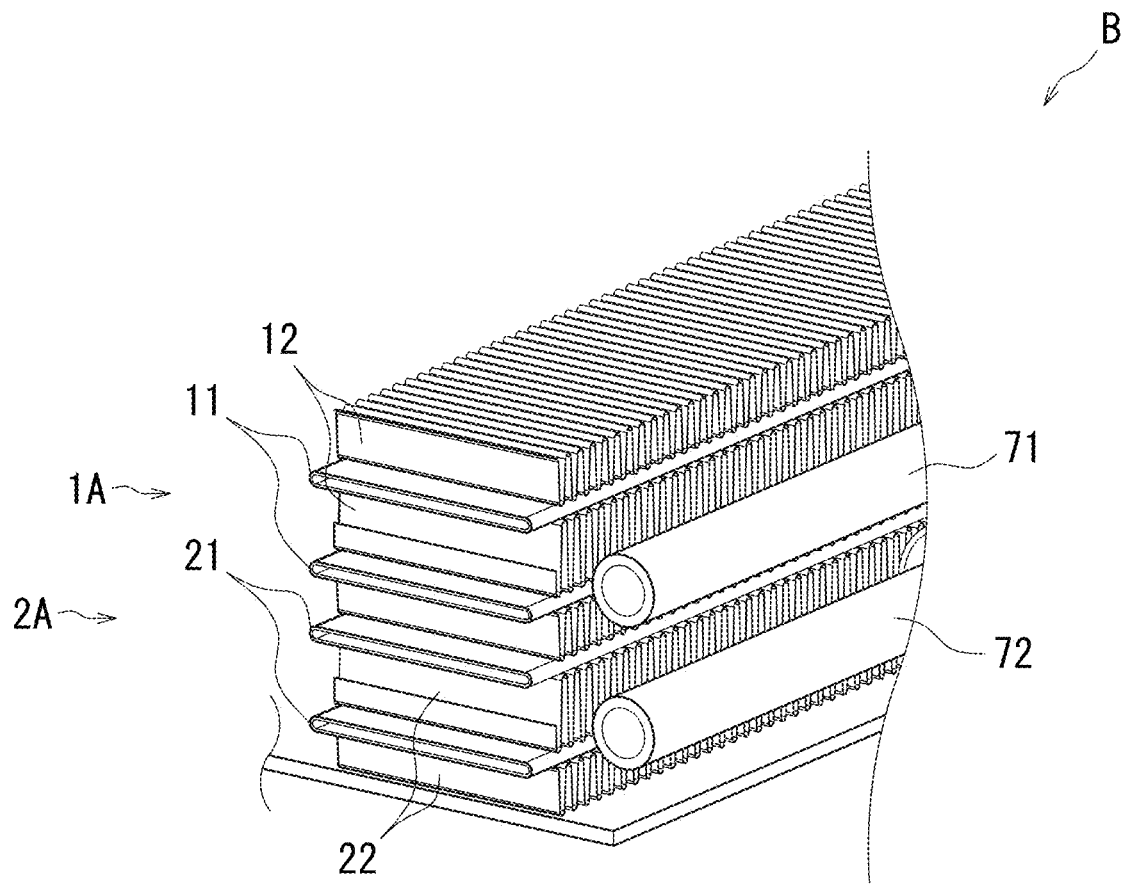
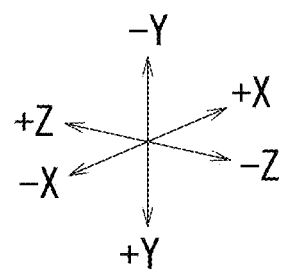
Fig. 17

HEAT DISSIPATION DEVICE AND COOLING UNIT

CROSS-REFERENCE TO RELATED APPLICATIONS

The present application claims priority under 35 U.S.C. § 119 to Japanese Patent Application No. 2021-034647, filed on Mar. 4, 2021, and Japanese Patent Application No. 2022-004418, filed on Jan. 14, 2022, the entire contents of which are hereby incorporated herein by reference.

1. FIELD OF THE INVENTION

The present invention relates to a heat dissipation device and a cooler.

2. BACKGROUND

There is conventionally known a cooling device in which a cooling plate, a heat dissipator such as a condenser, and a pump are connected, and a coolant flows through the cycle in order to cool a heating element such as a semiconductor element. A conventional cooling device includes two cooling plates and two condensers, and the two cooling plates, the two condensers, and a refrigerant pump are sequentially connected in series to form a refrigerant flow path.

In the conventional cooling device, two cooling plates are directly connected. Therefore, the refrigerant passes through one cooling plate to absorb heat, and then subsequently flows through the other cooling plate. Therefore, even if the refrigerant cooled in the condenser can sufficiently cool the first cooling plate, it sometimes cannot sufficiently cool the second cooling plate.

SUMMARY

A heat dissipation device according to a preferred embodiment of the present invention allows a coolant to flow into and out of a first cooling device and a second cooling device. The heat dissipation device includes a first heat dissipator, a second heat dissipator, a first tank connected to one side in a first direction of each of the first heat dissipator and the second heat dissipator, and a second tank connected to another side of each of the first heat dissipator and the second heat dissipator in the first direction. The coolant flows through an inside of the first heat dissipator, the second heat dissipator, the first tank, and the second tank. The first tank includes a tank-side first outflow port through which the coolant flows out to the first cooling device, and a tank-side first inflow port through which the coolant from the first cooling device flows in. The second tank includes a tank-side second outflow port through which the coolant flows out to the second cooling device, and a tank-side second inflow port through which the coolant from the second cooling device flows in. In the first heat dissipator, the coolant flowing in from the tank-side first inflow port flows from one side in the first direction to the other side in the first direction and flows out from the tank-side second outflow port. In the second heat dissipator, the coolant flowing in from the tank-side second inflow port flows from the other side in the first direction to the one side in the first direction and flows out from the tank-side first outflow port.

A cooler according to an example embodiment of the present invention includes the heat dissipation device described above, the first cooling device, and the second cooling device. The second heat dissipator, the first heat dissipator, and the first cooling device or the second cooling device are arranged in this order in a third direction orthogonal to the first direction and a second direction.

The above and other elements, features, steps, characteristics and advantages of the present disclosure will become more apparent from the following detailed description of the example embodiments with reference to the attached drawings.

BRIEF DESCRIPTION OF THE DRAWINGS

FIG. 9 is an overall perspective view of a cooler including a heat dissipation device according to a second example embodiment of the present invention.

FIG. 17 is a cross-sectional perspective view of the heat dissipation device according to the second example embodiment of the present invention taken along the second direction.

DETAILED DESCRIPTION

Example embodiments of the present invention will be described below with reference to the drawings. In the present description, a first direction X, a second direction Y, and a third direction Z orthogonal to one another are appropriately described for easy understanding. Here, a direction in which the heat dissipation device or a cooling pipe extends is referred to as the "first direction X". A direction orthogonal to the first direction X is referred to as the "second direction Y". Then, a direction orthogonal to the first direction X and the second direction Y is referred to as the "third direction Z".

A direction on one side in the first direction X is referred to as "one side in the first direction (−X direction)", and a direction on the other side is referred to as the "other side in the first direction (+X direction)". A direction on one side in the second direction Y is referred to as "one side (−Y direction) in the second direction", and a direction on the other side is referred to as the "other side (+Y direction) in the second direction". A direction on one side in the third direction Z is referred to as "one side in the third direction (−Z direction)", and a direction on the other side is referred to as the "other side in the third direction (+Z direction)".

In the present application, for convenience, the second direction Y may be described as an up-down direction. For example, one side (−Y direction) of the second direction Y indicates an upward direction, and the other side (+Y direction) of the second direction Y indicates a downward direction. However, the up-down direction, the upward direction, and the downward direction are defined for convenience of description, and do not need to coincide with the vertical direction. The up-down direction is defined merely for convenience of description, and the orientations in use of the heat dissipation device and the cooler according to the present invention are not limited. In the present description, the "orthogonal direction" does not represent orthogonal in a strict sense, and includes, for example, a case where the direction is orthogonal to a degree to which the effect of the present disclosure is achieved.

Figure 1:
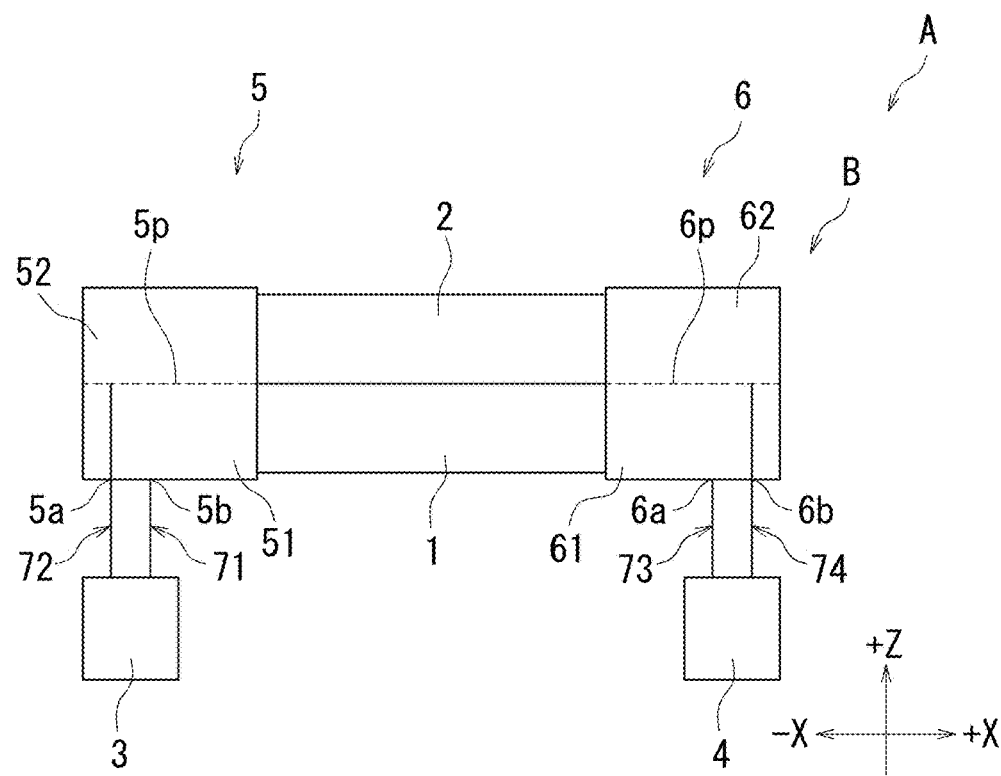
FIG. 1 is an outline view of a cooler including a heat dissipation device according to an example embodiment of the present invention.
Figure 2:
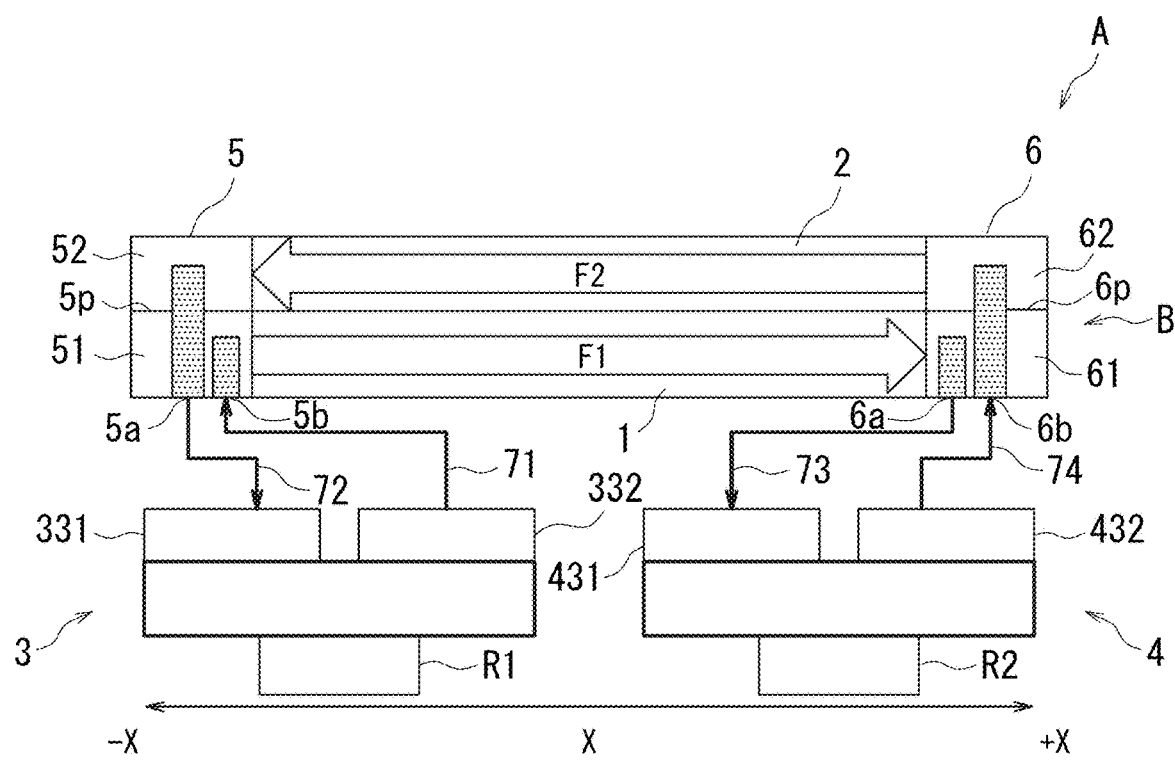
FIG. 2 is a schematic view of the cooler including the heat dissipation device of the example embodiment of the present invention.

A heat dissipation device B and a cooler A of the first example embodiment of the present invention will be described. FIG. 1 is an outline view of the cooler A including the heat dissipation device B of the first example embodiment. FIG. 2 is a schematic view of the cooler A including the heat dissipation device B of the first example embodiment.

As illustrated in FIGS. 1 and 2, the cooler A includes the heat dissipation device B, a first cooling device 3, and a second cooling device 4. The heat dissipation device B includes a first heat dissipator 1, a second heat dissipator 2, a first tank 5, and a second tank 6. The first tank 5 is positioned on one side (−X direction) in the first direction of the first heat dissipator 1 and the second heat dissipator 2, and the second tank 6 is positioned on the other side (+X direction) in the first direction of the first heat dissipator 1 and the second heat dissipator 2.

The cooler A further includes a first pipe 71, a second pipe 72, a third pipe 73, and a fourth pipe 74. One side of the first heat dissipator 1 and the first cooling device 3 are connected by the first pipe 71. Specifically, one side of the first heat dissipator 1 and the first cooling device 3 are connected by the first pipe 71 via the first tank 5. One side of the second heat dissipator 2 and the first cooling device 3 are connected by the second pipe 72. Specifically, one side of the second heat dissipator 2 and the first cooling device 3 are connected by the second pipe 72 via the first tank 5.

The other side of the first heat dissipator 1 and the second cooling device 4 are connected by the third pipe 73. Specifically, the other side of the first heat dissipator 1 and the second cooling device 4 are connected by the third pipe 73 via the second tank 6. The other side of the second heat dissipator 2 and the second cooling device 4 are connected by the fourth pipe 74. Specifically, the other side of the second heat dissipator 2 and the second cooling device 4 are connected by the fourth pipe 74 via the second tank 6.

The coolant returns from the second heat dissipator 2 of the heat dissipation device B to the heat dissipation device B through the second pipe 72, the first cooling device 3, and the first pipe 71, and then passes through the first heat dissipator 1 of the heat dissipation device B. The coolant returns from the first heat dissipator 1 of the heat dissipation device B to the heat dissipation device B through the third pipe 73, the second cooling device 4, and the fourth pipe 74, and then passes through the second heat dissipator 2 of the heat dissipation device B. Thereafter, the coolant flows again from the second heat dissipator 2 of the heat dissipation device B through the second pipe 72.

In the present example embodiment, the coolant is a liquid. As the coolant, for example, an antifreeze such as an ethylene glycol aqueous solution or a propylene glycol aqueous solution, pure water, or the like is used.

As illustrated in FIG. 2, the first cooling device 3 and the second cooling device 4 are in contact with a first heat generating component R1 and a second heat generating component R2, which are heat sources, and absorb heat from the first heat generating component R1 and the second heat generating component R2. Exemplary heat generating components include a microprocessor used in a computer and a power semiconductor used in an inverter. The coolant having absorbed heat in the first cooling device 3 and the second cooling device 4 flows to the first heat dissipator 1 and the second heat dissipator 2 through the first pipe 71 to the fourth pipe 74. The coolant having absorbed heat passes through the first heat dissipator 1 and the second heat dissipator 2, whereby heat is dissipated from the coolant to the outside in the first heat dissipator 1 and the second heat dissipator 2.

More specifically, the coolant having dissipated heat in the second heat dissipator 2 flows to the first cooling device 3 through the second pipe 72. The coolant having absorbed heat from the first heat generating component R1 in the first cooling device 3 flows to the first heat dissipator 1 through the first pipe 71. When the coolant flows through first heat dissipator 1 along F1 in FIG. 2, heat is dissipated from the coolant in the first heat dissipator 1. The coolant having dissipated heat in the first heat dissipator 1 flows to the second cooling device 4 through the third pipe 73. The coolant having absorbed heat from the second heat generating component R2 in the second cooling device 4 flows to the second heat dissipator 2 through the fourth pipe 74. When the coolant flows through the second heat dissipator 2 along F2 in FIG. 2, heat is dissipated from the coolant in the second heat dissipator 2.

In the cooler A, when the coolant flows in the above cycle, the coolant having absorbed heat in the first cooling device 3 dissipates heat in the first heat dissipator 1, and the cooled coolant flows into the second cooling device 4. Therefore, it is possible to suppress unevenness in cooling performance between the first cooling device 3 and the second cooling device 4.

The first tank 5 has a tank-side first outflow port 5a and a tank-side first inflow port 5b. In the first tank 5, the flow path opening of the second heat dissipator 2 and the tank-side first outflow port 5a communicate with each other. In the first tank 5, the flow path opening of the first heat dissipator 1 and the tank-side first inflow port 5b communicate with each other. In the first tank 5, the tank-side first outflow port 5a and the tank-side first inflow port 5b are not in direct communication with each other. In the first tank 5, the flow path opening of the first heat dissipator 1 and the flow path opening of the second heat dissipator 2 are not in direct communication.

Specifically, the first tank 5 has a plurality of tank chambers that do not directly communicate with each other inside the first tank 5. For example, the first tank 5 includes a first tank chamber 51 and a second tank chamber 52. The first tank chamber 51 and the second tank chamber 52 are partitioned by a first partition 5p.

The tank-side first outflow port 5a is connected to the second tank chamber 52. The tank-side first outflow port 5a may be provided in the second tank chamber 52. Alternatively, the tank-side first outflow port 5a may communicate with the second tank chamber 52 via the second pipe 72.

The tank-side first inflow port 5b is connected to the first tank chamber 51. The tank-side first inflow port 5b may be provided in the first tank chamber 51. Alternatively, the tank-side first inflow port 5b may communicate with the first tank chamber 51 via the first pipe 71.

The coolant in the first tank 5 flows out from the tank-side first outflow port 5a to the first cooling device 3. For example, the coolant in the first tank 5 flows from the second tank chamber 52 through the second pipe 72, and flows out from the tank-side first outflow port 5a to the first cooling device 3. The coolant having flowed through the first cooling device 3 flows through the first pipe 71 and flows into the first tank chamber 51 from the tank-side first inflow port 5b. The coolant having flowed into the first tank chamber 51 from the tank-side first inflow port 5b flows through the first heat dissipator 1.

The second tank 6 has a tank-side second outflow port 6a and a tank-side second inflow port 6b. In the second tank 6, the flow path opening of the first heat dissipator 1 and the tank-side second outflow port 6a communicate with each other. In the second tank 6, the flow path opening of the second heat dissipator 2 and the tank-side second inflow port 6b communicate with each other. In the second tank 6, the tank-side second outflow port 6a and the tank-side second inflow port 6b are not in direct communication with each other. In the second tank 6, the flow path opening of the first heat dissipator 1 and the flow path opening of the second heat dissipator 2 are not in direct communication.

Specifically, the second tank 6 has a plurality of tank chambers that do not directly communicate with each other inside the second tank 6. For example, the second tank 6 includes a third tank chamber 61 and a fourth tank chamber 62. The third tank chamber 61 and the fourth tank chamber 62 are partitioned by a second partition 6p.

The tank-side second outflow port 6a is connected to the third tank chamber 61. The tank-side second outflow port 6a may be provided in the third tank chamber 61. Alternatively, the tank-side second outflow port 6a may communicate with the third tank chamber 61 via the third pipe 73.

The tank-side second inflow port 6b is connected to the fourth tank chamber 62. The tank-side second inflow port 6b may be provided in the fourth tank chamber 62. Alternatively, the tank-side second inflow port 6b may communicate with the fourth tank chamber 62 via the fourth pipe 74.

The coolant in the second tank 6 flows out from the tank-side second outflow port 6a to the second cooling device 4. For example, the coolant in the second tank 6 flows from the tank-side second outflow port 6a of the third tank chamber 61 to the first cooling device 3 via the third pipe 73. The coolant having flowed through the first cooling device 3 flows through the fourth pipe 74 from the tank-side second inflow port 6b and flows into the fourth tank chamber 62. The coolant having flowed into the fourth tank chamber 62 flows through the second heat dissipator 2.

Figure 3:
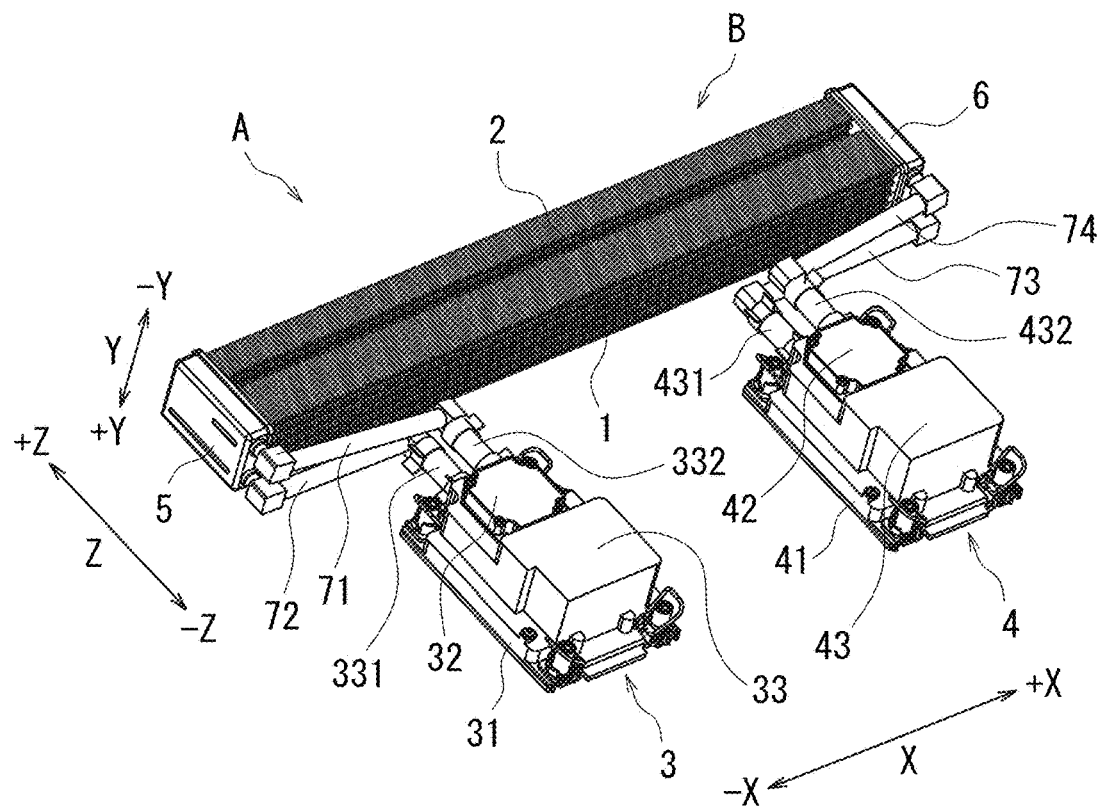
FIG. 3 is an overall perspective view of a cooler including a heat dissipation device according to a first example embodiment of the present invention.

Next, a detailed structure of the heat dissipation device B and the cooler A in the first example embodiment of the present invention will be described with reference to FIG. 3. FIG. 3 is an overall perspective view of the cooler A including the heat dissipation device B according to the first example embodiment of the present invention.

The cooler A includes the heat dissipation device B, the first cooling device 3, the second cooling device 4, the first pipe 71, the second pipe 72, the third pipe 73, and the fourth pipe 74. The first tank 5 and the first cooling device 3 are connected by the first pipe 71 and the second pipe 72. The second tank 6 and the second cooling device 4 are connected by the third pipe 73 and the fourth pipe 74.

The heat dissipation device B includes the first heat dissipator 1, the second heat dissipator 2, the first tank 5, and the second tank 6. The first tank 5 is attached to one side (−X direction) in the first direction X of the first heat dissipator 1 and the second heat dissipator 2. The second tank 6 is attached to the other side (+X direction) in the first direction X of the first heat dissipator 1 and the second heat dissipator 2. The first tank 5 and the first cooling device 3 are connected by the first pipe 71 and the second pipe 72. The second tank 6 and the second cooling device 4 are connected by the third pipe 73 and the fourth pipe 74.

Here, the first heat dissipator 1 and the second heat dissipator 2 are arranged side by side in the third direction Z. The first heat dissipator 1 is positioned on one side (−Z direction) in the third direction Z, and the second heat dissipator 2 is positioned on the other side (+Z direction) in the third direction Z.

The first cooling device 3 and the second cooling device 4 are arranged side by side in the X direction. The first cooling device 3 is positioned on one side (−X direction) in the first direction X, and the second cooling device 4 is positioned on the other side (+X direction) in the first direction X. The first cooling device 3 and the second cooling device 4 are positioned on one side (−Z direction) in the third direction Z with respect to the heat dissipation device B.

The first cooling device 3 includes a cold plate 31, a pump 32, and a casing 33. The pump 32 is positioned on one side (−Y direction) in the second direction of the casing 33. Here, the pump 32 is positioned on the other side (+Z direction) in the third direction on the surface on one side (−Y direction) in the second direction of the casing 33. The cold plate 31 is positioned on the other side (+Y direction) in the second direction of the casing 33.

The second cooling device 4 includes a cold plate 41, a pump 42, and a casing 43. The pump 42 is positioned on one side (−Y direction) in the second direction of the casing 43. Here, the pump 42 is positioned on the other side (+Z direction) in the third direction on the surface on one side (−Y direction) in the second direction of the casing 43. The cold plate 41 is positioned on the other side (+Y direction) in the second direction of the casing 43.

The surfaces of the cold plate 31 and the cold plate 41 on the other side (+Y direction) in the second direction Y are in contact with the first heat generating component R1 and the second heat generating component R2 (FIG. 2), respectively. The coolant passes through the surfaces of the cold plate 31 and the cold plate 41 on one side (−Y direction) in the second direction Y. The cold plate 31 and the cold plate 41 are plate materials made of copper or aluminum. The cold plate 31 and the cold plate 41 absorb heat from heat generating components (not illustrated in FIG. 3) and transfer heat to the coolant.

The coolant circulates by the pump 32 and the pump 42. The pump 32 and the pump 42 are centrifugal pumps, suck up cooling water from the other side (+Y direction) in the second direction Y, and discharge the cooling water in a direction orthogonal to the second direction Y. In the first example embodiment, the pump 32 and the pump 42 are arranged on one side (−Y direction) in the second direction Y of the casing 33 and the casing 43. However, the pump 32 and the pump 42 may be arranged in any of the first pipe 71 to the fourth pipe 74 at positions different from the positions of the first cooling device 3 and the second cooling device 4. Here, the pump 32 and the pump 42 are arranged in the first cooling device 3 and the second cooling device 4, respectively. This can maintain redundancy of the cooler A, and can continue to circulate the coolant. The number of pumps may be one, three, or more.

As illustrated in FIGS. 2 and 3, in the first cooling device 3, the casing 33 has a first inflow port 331 and a first outflow port 332. The first inflow port 331 is connected to the second pipe 72. The first outflow port 332 is connected to the first pipe 71. The casing 33 has a flow path therein. In the first cooling device 3, the coolant flowing in from the first inflow port 331 flows through the flow path in the casing 33, flows through the cold plate 31 and the pump 32, and flows out from the first outflow port 332.

In the second cooling device 4, the casing 43 has a second inflow port 431 and a second outflow port 432. The second inflow port 431 is connected to the third pipe 73. The second outflow port 432 is connected to the fourth pipe 74. In the second cooling device 4, the coolant flowing in from the second inflow port 431 flows through the flow path in the casing 43, flows through the cold plate 41 and the pump 42, and flows out from the second outflow port 432.

Figure 4A:
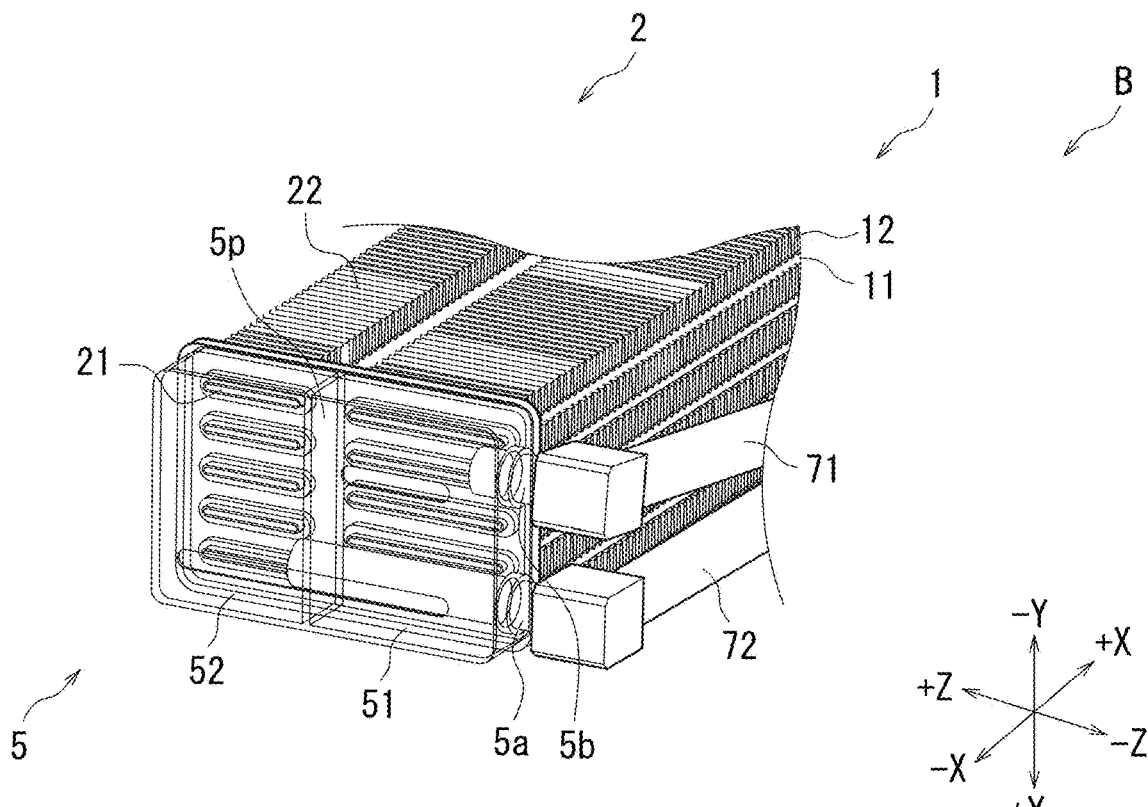
FIG. 4A is a partially transparent perspective view of the vicinity of a first tank in the heat dissipation device according to the first example embodiment of the present invention.
Figure 4B:
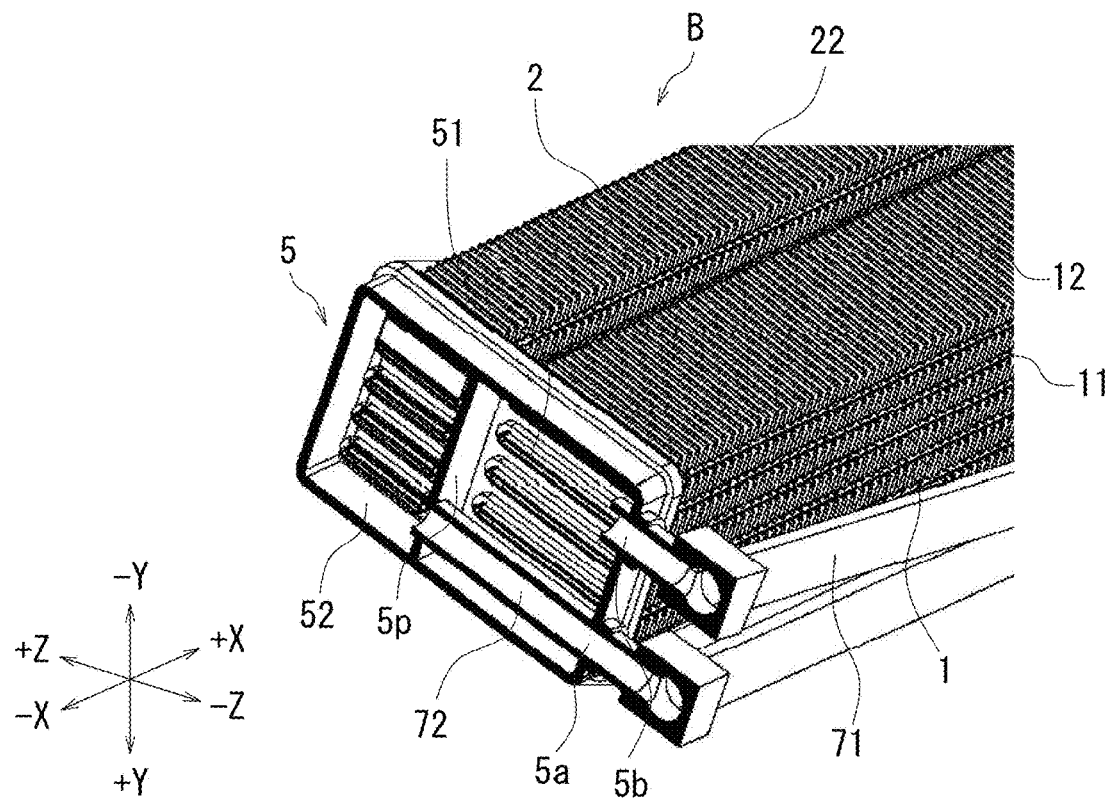
FIG. 4B is a cross-sectional perspective view of the first tank of the heat dissipation device according to the first example embodiment of the present invention taken along the second direction.
Figure 5A:
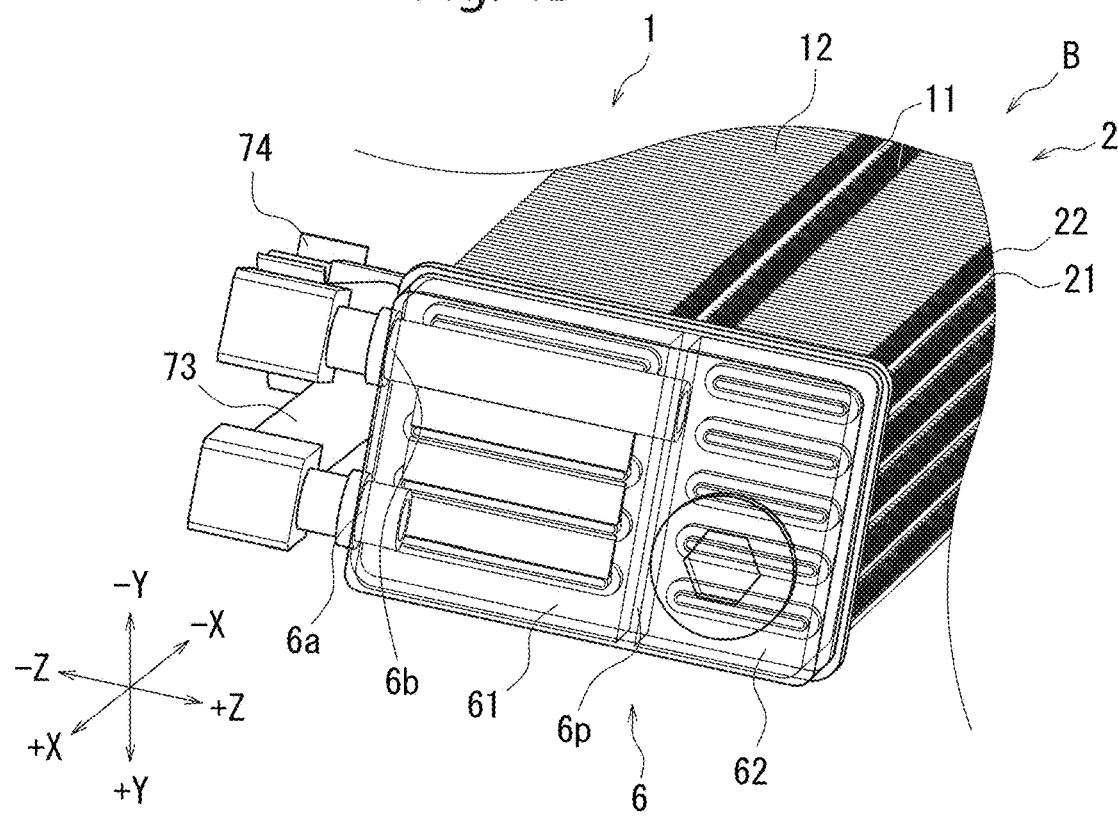
FIG. 5A is a partially transparent perspective view of the vicinity of the second tank in the heat dissipation device according to the first example embodiment of the present invention.
Figure 5B:
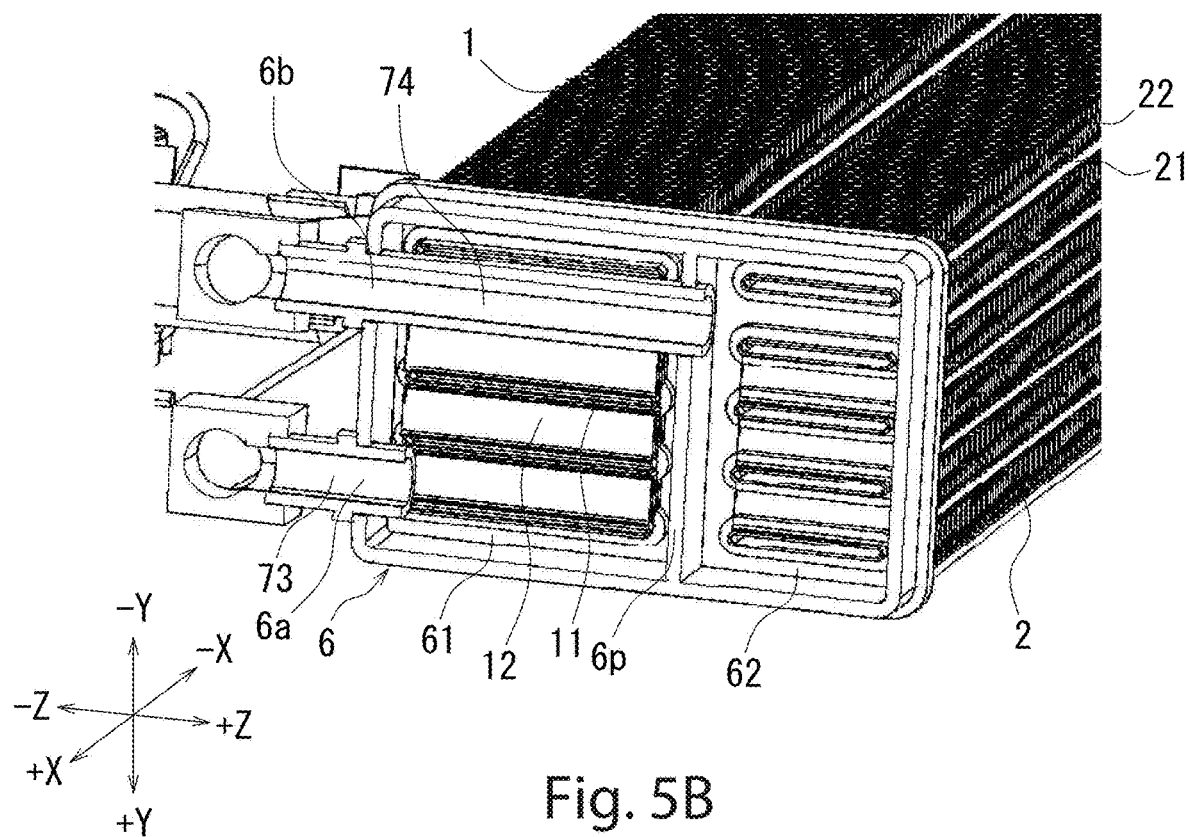
FIG. 5B is a cross-sectional perspective view of the second tank of the heat dissipation device according to the first example embodiment of the present invention taken along the second direction.
Figure 6:
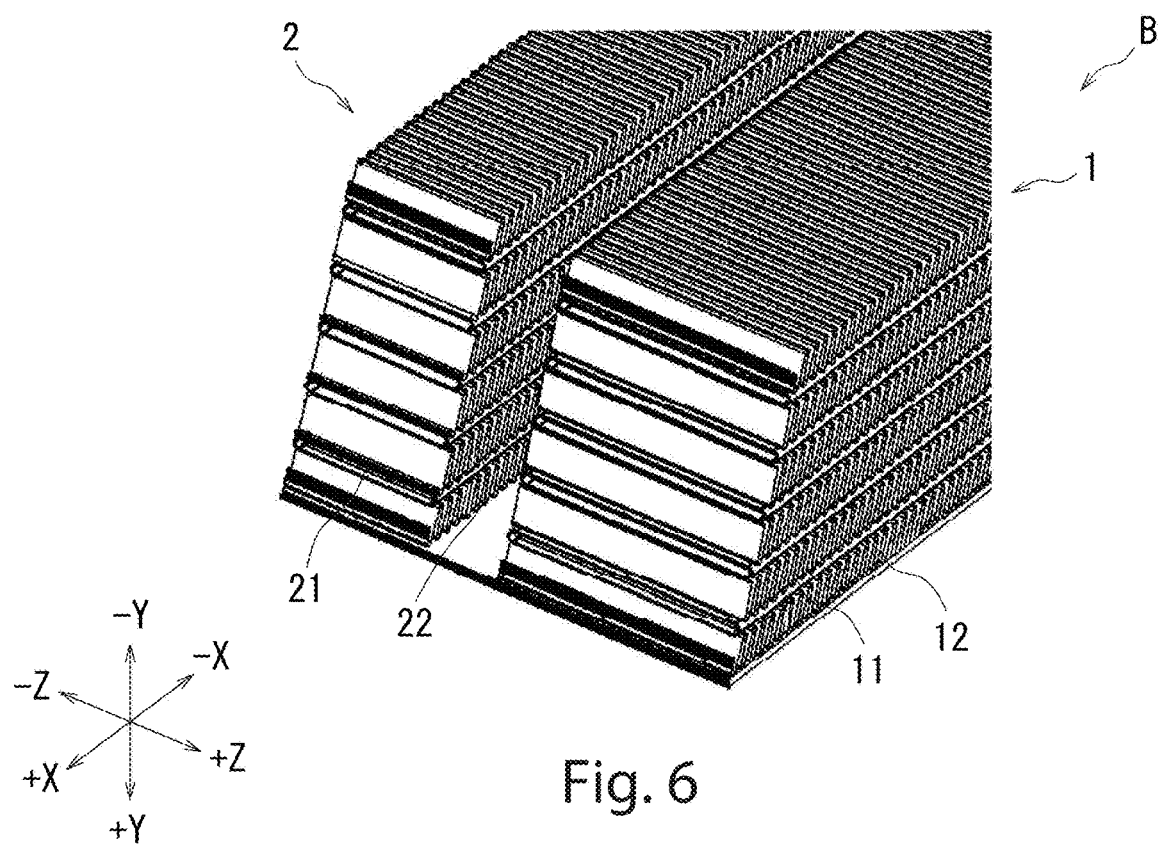
FIG. 6 is a cross-sectional perspective view of the heat dissipation device according to the first example embodiment of the present invention taken along the second direction.

The structure of the heat dissipation device B will be described with reference to FIGS. 4A to 6. FIG. 4A is a schematic partially enlarged perspective view in which the vicinity of the first tank 5 of the heat dissipation device B according to the first example embodiment of the present invention is enlarged. FIG. 4B is a cross-sectional perspective view of the first tank 5 of the heat dissipation device according to the first example embodiment of the present invention taken along the second direction Y. FIG. 5A is a schematic partially enlarged perspective view in which the vicinity of the second tank 6 of the heat dissipation device B according to the first example embodiment of the present invention is enlarged. FIG. 5B is a cross-sectional perspective view of the second tank 6 of the heat dissipation device B according to the first example embodiment of the present invention taken along the second direction Y. FIG. 6 is a cross-sectional perspective view of the heat dissipation device B according to the first example embodiment of the present invention taken along the second direction Y.

As illustrated in FIGS. 4A to 6, the first heat dissipator 1 includes a first cooling pipe 11 and a first fin 12. Here, the first heat dissipator 1 includes a plurality of the first cooling pipes 11 and a plurality of the first fins 12. The first cooling pipe 11 is a tubular component made of a metal material having excellent thermal conductivity, such as copper or aluminum, and extends in the first direction X.

The first fin 12 extends from the first cooling pipe 11 in the second direction Y. Here, the first fin 12 is a plate-like component made of a metal material having excellent thermal conductivity, such as copper or aluminum. The first fin 12 is formed by extending in the second direction Y and extending in a corrugated manner in the first direction X. Since the first fin 12 is formed in a corrugated manner, an area in contact with air can be increased, and heat dissipation can be improved.

The plurality of first cooling pipes 11 and the plurality of first fins 12 are alternately stacked in the second direction Y. The first fin 12 is in contact with the outer peripheral surface of each of the plurality of first cooling pipes 11. More specifically, the first cooling pipe 11 and the first fin 12 are connected by brazing. When the coolant having absorbed heat passes through the inside of the first cooling pipe 11, the heat of the coolant is transferred from the first cooling pipe 11 to the first fin 12, and is released to the outside through the first fin 12.

The second heat dissipator 2 includes a second cooling pipe 21 and a second fin 22. Here, the second heat dissipator 2 includes a plurality of the second cooling pipes 21 and a plurality of the second fins 22. The second heat dissipator 2 has the same configuration as that of the first heat dissipator 1 except for the size and position, and redundant description will be omitted.

As illustrated in FIG. 6, the first heat dissipator 1 and the second heat dissipator 2 each extend in the first direction X. The first heat dissipator 1 and the second heat dissipator 2 are arranged side by side in the third direction Z. Here, the size of the first heat dissipator 1 is larger than that of the second heat dissipator 2. More specifically, the length of the first heat dissipator 1 along the second direction Y is substantially equal to the length of the second heat dissipator 2 along the second direction Y, but the length of the first heat dissipator 1 along the third direction Z is larger than the length of the second heat dissipator 2 along the third direction Z. Therefore, when cross sections of the first heat dissipator 1 and the second heat dissipator 2 cut in the second direction Y are viewed, the cross-sectional area of the first heat dissipator 1 is larger than the cross-sectional area of the second heat dissipator 2.

Next, structures of the first tank 5 and the second tank 6 will be described with reference to FIGS. 4A to 5B.

As illustrated in FIGS. 4A and 4B, the first tank 5 is arranged on one side (−X direction) in the first direction X of the first heat dissipator 1 and the second heat dissipator 2. The first tank 5 is divided by the first partition 5*p* into the first tank chamber 51 and the second tank chamber 52. Here, the first partition 5*p* extends in the second direction Y and separates the first tank 5 in the third direction Z. The first tank chamber 51 is positioned on one side (−Z direction) in the third direction, and the second tank chamber 52 is positioned on the other side (+Z direction) in the third direction. The first tank chamber 51 is connected to one side of the plurality of first cooling pipes 11 and is connected to the first outflow port 332 of the first cooling device 3 illustrated in FIGS. 2 and 3. The second tank chamber 52 is connected to one side of the plurality of the second cooling pipes 21 and is connected to the first inflow port 331 of the first cooling device 3. The first pipe (connection pipe) 71 is connected to the first tank chamber 51. The second pipe (connection pipe) 72 is connected to the second tank chamber 52. A part of the second pipe 72 passes through the first tank chamber 51. A part of the second pipe 72 is arranged to pass through the inside of the first tank chamber 51, so that the width of the cooler A in the first direction X can be reduced.

As illustrated in FIGS. 5A and 5B, the second tank 6 is arranged on the other side (+X direction) in the first direction X of the first heat dissipator 1 and the second heat dissipator 2. The second tank 6 is divided by the second partition 6*p* into the third tank chamber 61 and the fourth tank chamber 62. Here, the second partition 6*p* extends in the second direction Y and separates the second tank 6 in the third direction Z. The third tank chamber 61 is positioned on one side (−Z direction) in the third direction, and the fourth tank chamber 62 is positioned on the other side (+Z direction) in the third direction. The third tank chamber 61 is connected to the other side of the plurality of first cooling pipes 11 and is connected to the second inflow port 431 of the second cooling device 4 illustrated in FIGS. 2 and 3. The fourth tank chamber 62 is connected to the other side of the plurality of the second cooling pipes 21 and is connected to the second outflow port 432 of the second cooling device 4. The third pipe (connection pipe) 73 is connected to the third tank chamber 61. The fourth pipe (connection pipe) 74 is connected to the fourth tank chamber 62. A part of the fourth pipe 74 passes through the third tank chamber 61. A part of the fourth pipe 74 is arranged to pass through the inside of the third tank chamber 61, so that the width of the cooler A in the first direction X can be reduced.

By providing the first tank 5 and the second tank 6, it is possible to increase the capacity of the coolant in the cooler A. The coolant in the cooler A gradually evaporates and decreases from a connection portion of the pipe or the like. The decrease in the coolant may degrade the cooling performance of the heat generating component. On the other hand, by providing the first tank 5 and the second tank 6, it is possible to secure the amount of the coolant and reduce the degradation of the cooling performance.

In the present example embodiment, the heat dissipation device B causes the coolant to flow into and out of the first cooling device 3 and the second cooling device 4. The heat dissipation device B includes a first heat dissipator 1, a second heat dissipator 2, a first tank 5, and a second tank 6. The first tank 5 is connected to one side (−X direction) in the first direction of each of the first heat dissipator 1 and the second heat dissipator 2. The second tank 6 is connected to the other side (+X direction) in the first direction of each of the first heat dissipator 1 and the second heat dissipator 2. The coolant flows through inside of the first heat dissipator 1, the second heat dissipator 2, the first tank 5, and the second tank 6.

The first tank 5 has the tank-side first outflow port 5*a* through which the coolant flows out to the first cooling device 3, and the tank-side first inflow port 5*b* through which the coolant from the first cooling device 3 flows in. The second tank 6 has the tank-side second outflow port 6*a* through which the coolant flows out to the second cooling device 4 and the tank-side second inflow port 6*b* through which the coolant from the second cooling device 4 flows in. In the first heat dissipator 1, the coolant flowing in from the tank-side first inflow port 5*b* flows from one side (−X direction) in the first direction to the other side (+X direction) in the first direction and flows out from the tank-side second outflow port 6*a*. In the second heat dissipator 2, the coolant flowing in from the tank-side second inflow port 6*b* flows from the other side (+X direction) in the first direction to one side (−X direction) in the first direction and flows out from the tank-side first outflow port 5*a*.

According to the heat dissipation device B of the present example embodiment, the first cooling device 3 can be cooled by the coolant having dissipated heat in the second heat dissipator 2, and the second cooling device 4 can be cooled by the coolant having dissipated heat in the first heat dissipator 1. Therefore, the circulation of the coolant allows the first heat dissipator 1 and the second heat dissipator 2 to efficiently dissipate heat and efficiently cool the first cooling device 3 and the second cooling device 4. Since the coolant flows in and out of the first cooling device 3 from the first tank 5 and the coolant flows in and out of the second cooling device 4 from the second tank 6, shortage of the circulating coolant due to evaporation of the coolant is suppressed. Furthermore, it is possible to suppress the configuration of the first pipe 71 to the fourth pipe 74 connecting the heat dissipation device B with the first cooling device 3 and the second cooling device 4 from becoming complicated.

The first heat dissipator 1 includes the first cooling pipe 11 and the first fin 12. The first cooling pipe 11 extends in the first direction X. The coolant passes through the first cooling pipe 11. The first fin 12 is in contact with the outer peripheral surface of the first cooling pipe 11. The first fin 12 extends in the second direction Y orthogonal to the first direction X.

The second heat dissipator 2 includes a second cooling pipe 21 and a second fin 22. The second cooling pipe 21 extends in the first direction X. The coolant passes through the second cooling pipe 21. The second fin 22 is in contact with the outer peripheral surface of the second cooling pipe 21. The second fin 22 extends in the second direction Y.

The first heat dissipator 1 and the second heat dissipator 2 are arranged in the third direction Z orthogonal to the first direction X and the second direction Y. The first tank 5 is divided by the first partition 5*p* into the first tank chamber 51 and the second tank chamber 52. The first tank chamber 51 is connected to the tank-side first inflow port 5*b*. The second tank chamber 52 is connected to the tank-side first outflow port 5*a*.

The second tank 6 is divided by the second partition 6*p* into the third tank chamber 61 and the fourth tank chamber 62. The third tank chamber 61 is connected to the tank-side second outflow port 6*a*. The fourth tank chamber 62 is connected to the tank-side second inflow port 6*b*.

By arranging the first heat dissipator 1 and the second heat dissipator 2 in a direction (Z direction) orthogonal to the direction (Y direction) in which the first fin 12 and the second fin 22 extend from the first cooling pipe 11 and the second cooling pipe 21, respectively, it is possible to adjust the cooling performance according to the cross-sectional areas of the first heat dissipator 1 and the second heat dissipator 2.

The cooler A further includes a first pipe 71, a second pipe 72, a third pipe 73, and a fourth pipe 74. The first pipe 71 connects the first tank chamber 51 and the first cooling device 3. The second pipe 72 connects the second tank chamber 52 and the first cooling device 3. The third pipe 73 connects the third tank chamber 61 and the second cooling device 4. The fourth pipe 74 connects the fourth tank chamber 62 and the second cooling device 4. Accordingly, the coolant can efficiently circulate through the heat dissipation device B, the first cooling device 3, and the second cooling device 4.

The second pipe 72 passes through the first tank chamber 51, penetrates the first partition 5p, and is connected to the second tank chamber 52. Due to this, even when the second pipe 72 is connected to the second tank chamber 52 positioned on the side away from the first cooling device 3, the second pipe 72 is connected through the first tank chamber 51, and therefore the size of the entire heat dissipation device B can be reduced. The fourth pipe 74 passes through the third tank chamber 61, penetrates the second partition 6p, and is connected to the fourth tank chamber 62. Due to this, even when the fourth pipe 74 is connected to the fourth tank chamber 62 positioned on the side away from the second cooling device 4, the fourth pipe 74 is connected through the third tank chamber 61, and therefore the size of the entire heat dissipation device B can be reduced.

Figure 7:
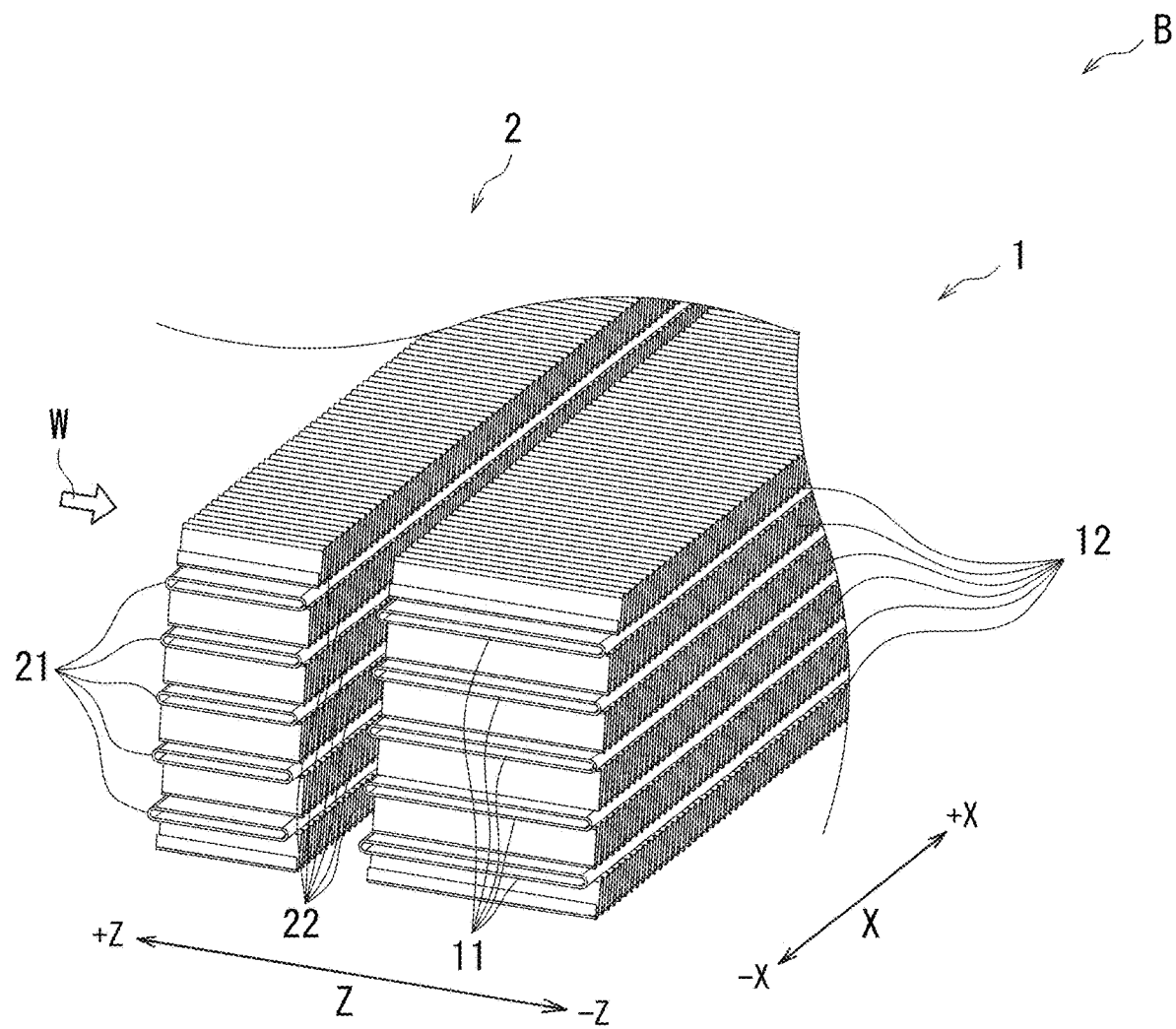
FIG. 7 is a schematic cross-sectional perspective view of the heat dissipation device according to the first example embodiment of the present invention.

Next, the heat dissipation device B according to the first example embodiment of the present invention will be described with reference to FIG. 7. FIG. 7 is a schematic cross-sectional view of the heat dissipation device B according to the first example embodiment of the present invention.

As illustrated in FIG. 7, when wind W blows to the heat dissipation device B, the wind W preferably blows from the other side (+Z direction) in the third direction Z of the heat dissipation device B. In this case, the other side (+Z direction) in the third direction Z of the heat dissipation device B is positioned on the windward side of the wind W. In the heat dissipation device B, the first heat dissipator 1 and the second heat dissipator 2 are arranged side by side in the third direction Z. The first heat dissipator 1 is positioned on one side (−Z direction) in the third direction Z, and the second heat dissipator 2 is positioned on the other side (+Z direction) in the third direction Z.

In this case, since the cross-sectional area of the first heat dissipator 1 is larger than the cross-sectional area of the second heat dissipator 2, even if the temperature of the wind hitting the first heat dissipator 1 that releases the heat absorbed in the first cooling device 3 is higher than the temperature of the wind hitting the second heat dissipator 2 that releases the heat absorbed in the second cooling device 4, the heat dissipation performances of the first heat dissipator 1 and the second heat dissipator 2 can be adjusted to the same extent.

The heat dissipation performances of the first heat dissipator 1 and the second heat dissipator 2 are affected by temperature, strength, and the like of air or wind flowing around the first heat dissipator 1 and the second heat dissipator 2, and therefore the heat dissipation performances of the first heat dissipator 1 and the second heat dissipator 2 are sometimes different depending on positions. In the first example embodiment, the wind W flows from the second heat dissipator 2 in the third direction Z. Therefore, air having heat released from the second heat dissipator 2 flows through the first heat dissipator 1. Since the air flowing to the first heat dissipator 1 has heat released from the second heat dissipator, when the sizes of the first heat dissipator 1 and the second heat dissipator 2 are the same, even if the air passes through the first heat dissipator 1, heat is sometimes not released to the same extent as the second heat dissipator 2. Therefore, by making the size of the first heat dissipator 1 larger than that of the second heat dissipator 2, the surface on which the outside air is in contact with the first heat dissipator 1 becomes large, and thus the heat dissipation performance in the first heat dissipator 1 is improved. Therefore, the coolant having the same temperature as the coolant flowing into the first cooling device 3 flows into the second cooling device 4, and the cooling performances of the first cooling device 3 and the second cooling device 4 can be equalized.

Thus, when cut surfaces obtained by cutting the first heat dissipator 1 and the second heat dissipator 2 along the second direction Y are viewed from the first direction X, the cross-sectional area of the first heat dissipator 1 is larger than the cross-sectional area of the second heat dissipator 2. By making the cross-sectional area of the first heat dissipator 1 larger than the cross-sectional area of the second heat dissipator 2, the cooling performances of the first heat dissipator 1 and the second heat dissipator 2 can be equalized.

Figure 8A:
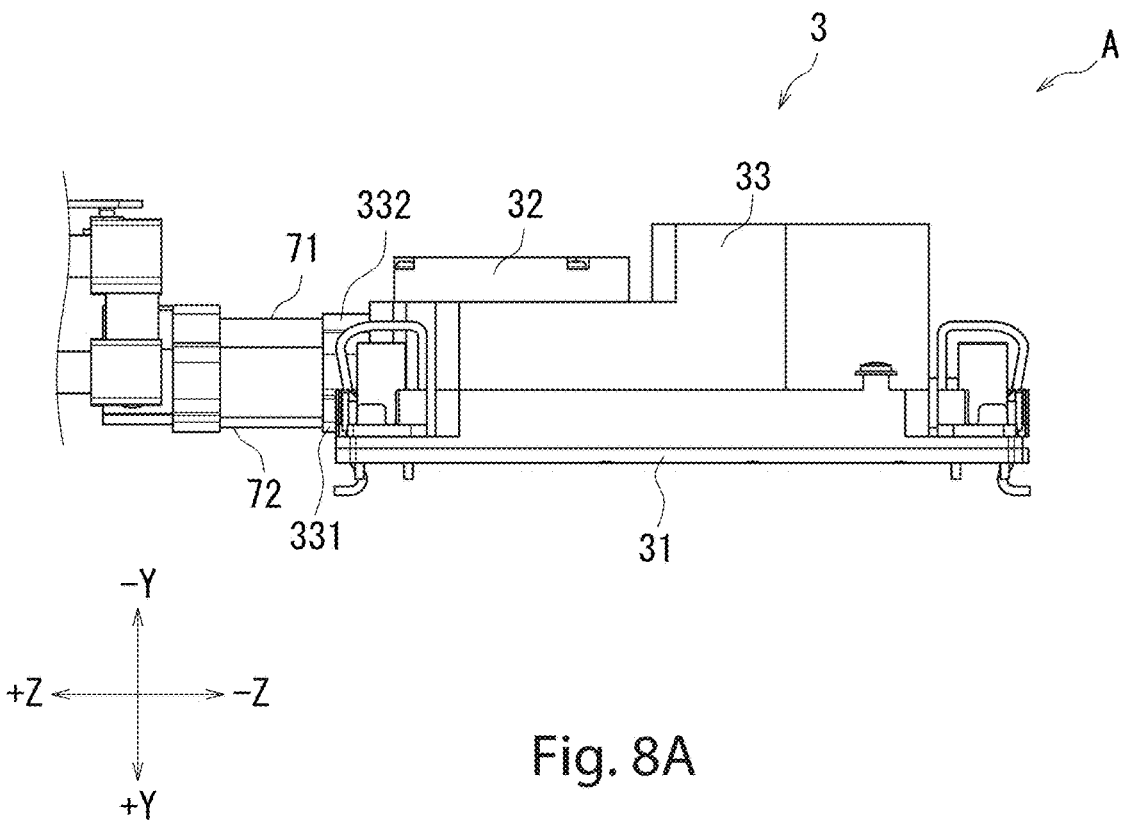
FIG. 8A is a schematic side view of a cooler according to the first example embodiment of the present invention.
Figure 8B:
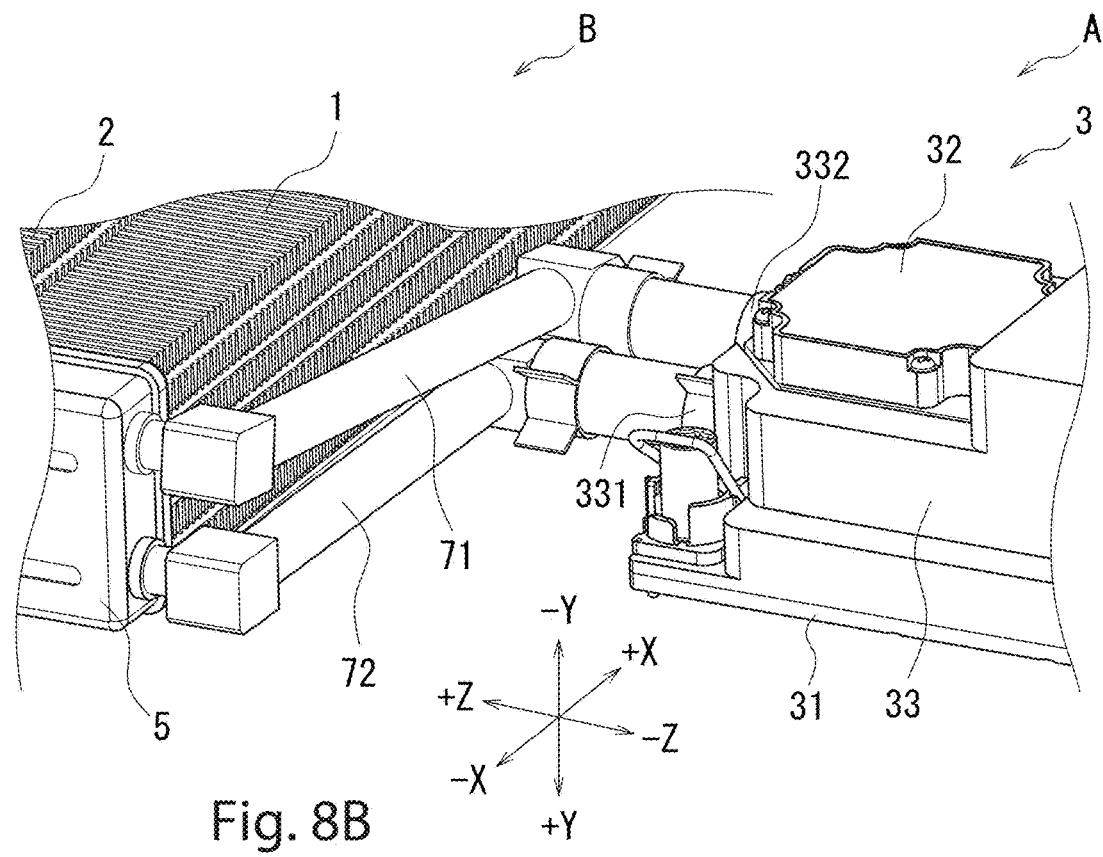
FIG. 8B is a schematic side view of the cooler according to the first example embodiment of the present invention.

Next, the cooler A according to the first example embodiment of the present invention will be described with reference to FIGS. 1 to 8B. FIG. 8A is a schematic side view of the cooler A according to the first example embodiment of the present invention. FIG. 8B is a schematic side view of the cooler A according to the first example embodiment of the present invention. The second cooling device 4 also has the same configuration as that of the first cooling device 3, but the first cooling device 3 will be mainly described here with reference to FIGS. 8A and 8B.

As described above, in the cooler A, one side of the first heat dissipator 1 and the first cooling device 3 are connected by the first pipe 71 via the first tank 5. One side of the second heat dissipator 2 and the first cooling device 3 are connected by the second pipe 72 via the first tank 5.

As described above, the pumps 32 and 42 mounted on the first cooling device 3 and the second cooling device 4 are centrifugal pumps. The centrifugal pump sucks up cooling water from the other side (+Y direction) in the second direction Y to one side (−Y direction) in the second direction Y, and discharges the cooling water in the centrifugal direction (first direction X or third direction Z).

In the first cooling device 3, the first inflow port 331 and the first outflow port 332 are positioned on the other side (+Z direction) in the third direction Z with respect to the casing 33. In the first cooling device 3, the first inflow port 331 is positioned on one side (−Y direction) in the second direction Y relative to the first outflow port 332. Therefore, the position of the second pipe 72 connected to the first inflow port 331 is positioned on the other side in the second direction Y relative to the position of the first pipe 71 connected to the first outflow port 332.

FIGS. 8A and 8B illustrate the configuration of the first cooling device 3 in the cooler A, and the second cooling device 4 also has the same configuration as that of the first cooling device 3. Therefore, in the second cooling device 4, the second inflow port 431 is positioned on the other side in the second direction Y relative to the second outflow port 432. The position of the third pipe 73 connected to the second inflow port 431 is positioned on the other side in the second direction Y relative to the position of the fourth pipe 74 connected to the second outflow port 432.

The first cooling device 3 includes the cold plate 31, the pump 32, and the casing 33. The pump 32 is positioned on one side (−Y direction) in the second direction with respect to the casing 33. The pump 32 is a centrifugal pump. In the first cooling device 3, the first pipe 71 is positioned on one side (−Y direction) in the second direction relative to the second pipe 72.

According to the configuration of the centrifugal pump that sucks up the coolant from the other side (+Y direction) in the second direction and causes the coolant to flow in the circumferential direction, the first pipe 71 through which the coolant flows out from the first cooling device 3 is positioned on one side (−Y direction) in the second direction relative to the second pipe 72 through which the coolant flows into the first cooling device 3, whereby the flow path of the coolant in the first cooling device 3 can be simplified.

In the cooler A, the second heat dissipator 2, the first heat dissipator 1, and the first cooling device 3 are arranged in this order in the third direction Z orthogonal to the first direction X and the second direction Y. The second heat dissipator 2, the first heat dissipator 1, and the second cooling device 4 are arranged in this order in the third direction Z orthogonal to the first direction X and the second direction Y.

The cooler A includes the heat dissipation device B, the first cooling device 3, and the second cooling device 4. In the cooler A, the second heat dissipator 2, the first heat dissipator 1, and the first cooling device 3 or the second cooling device 4 are arranged in this order in the third direction Z orthogonal to the first direction X and the second direction Y. This makes it possible to efficiently flow air to the first fin 12 and the second fin 22 while avoiding the flow of the air from being obstructed by the first cooling device 3 or the second cooling device 4.

In the heat dissipation device B illustrated in FIGS. 2 to 8B, the first heat dissipator 1 and the second heat dissipator 2 are positioned side by side in the third direction Z direction, but the present example embodiment is not limited to this. The first heat dissipator 1 and the second heat dissipator 2 may be positioned side by side in the second direction Y direction.

In the heat dissipation device B and/or the cooler A illustrated in FIGS. 2 to 8B, the first partition 5p separates the first tank 5 in the third direction Z, and the first tank chamber 51 and the second tank chamber 52 are positioned side by side in the Y direction. However, the present example embodiment is not limited to this. While the second partition 6p separates the second tank 6 in the third direction Z, and the third tank chamber 61 and the fourth tank chamber 62 are positioned side by side in the Y direction, the present example embodiment is not limited to this.

In the first cooling device 3 of the cooler A illustrated in FIGS. 8A and 8B, the first outflow port 332 is arranged on the other side (+Y direction) in the second direction relative to the first inflow port 331, and in the second cooling device 4, the second outflow port 432 is arranged on the other side (+Y direction) in the second direction relative to the second inflow port 431. However, the present example embodiment is not limited to this. In the first cooling device 3, the first outflow port 332 may be arranged at the same height in the second direction Y as that of the first inflow port 331. In the second cooling device 4, the second outflow port 432 may be arranged at the same height in the second direction Y as that of the second inflow port 431.

Next, the heat dissipation device B and the cooler A according to the second example embodiment of the present invention will be described. First, the cooler A including the heat dissipation device B according to the second example embodiment of the present invention will be described with reference to FIG. 9. FIG. 9 is an overall perspective view of the cooler A including the heat dissipation device B according to the second example embodiment of the present invention.

As illustrated in FIG. 9, the cooler A includes the heat dissipation device B, the first cooling device 3, and the second cooling device 4. The heat dissipation device B includes a first heat dissipator 1A, a second heat dissipator 2A, a first tank 5A, and a second tank 6A. The first heat dissipator 1A and the second heat dissipator 2A are arranged in the second direction Y. Here, the first heat dissipator 1A is arranged to be stacked in the second direction Y with respect to the second heat dissipator 2A. The first tank 5A is positioned on one side (−X direction) in the first direction of the first heat dissipator and the second heat dissipator 2A, and the second tank 6A is positioned on the other side (+X direction) in the first direction of the first heat dissipator and the second heat dissipator 2A.

The first heat dissipator 1A has a part 1Aa and a part 1Ab separated from the part 1Aa. In the first heat dissipator 1A, the part 1Aa and the part 1Ab are arranged side by side in the third direction Z. The part 1Aa is positioned on one side (−Z direction) in the third direction, and the part 1Ab is positioned on the other side (+Z direction) in the third direction.

The second heat dissipator 2A has a part 2Aa and a part 2Ab separated from the part 2Aa. In the second heat dissipator 2A, the part 2Aa and the part 2Ab are arranged side by side in the third direction Z. The part 2Aa is positioned on one side (−Z direction) in the third direction, and the part 2Ab is positioned on the other side (+Z direction) in the third direction.

The part 1Aa of the first heat dissipator 1A is arranged side by side in the second direction Y with the part 2Aa of the second heat dissipator 2A. The part 1Ab of the first heat dissipator 1A is arranged side by side in the second direction Y with the part 2Ab of the second heat dissipator 2A.

Here, the parts 1Aa and 2Aa are larger in size than the parts 1Ab and 2Ab. More specifically, while the lengths of the part 1Aa and the part 2Aa along the second direction Y are substantially equal to the lengths of the part 1Ab and the part 2Ab along the second direction Y, the lengths of the part 1Aa and the part 2Aa along the third direction Z are larger than the lengths of the part 1Ab and the part 2Ab along the third direction Z. Therefore, when cross sections of the first heat dissipator 1A and the second heat dissipator 2A cut in the second direction Y are viewed, the cross-sectional area of the first heat dissipator 1A is larger than the cross-sectional area of the second heat dissipator 2A.

The cooler A further includes a first pipe 71, a second pipe 72, a third pipe 73, and a fourth pipe 74. One side of the first heat dissipator 1A and the first cooling device 3 are connected by the first pipe 71. Specifically, one side of the first heat dissipator 1A and the first cooling device 3 are connected by the first pipe 71 via the first tank 5A. One side of the second heat dissipator 2A and the first cooling device 3 are connected by the second pipe 72. Specifically, one side of the second heat dissipator 2A and the first cooling device 3 are connected by the second pipe 72 via the first tank 5A.

The other side of the first heat dissipator 1A and the second cooling device 4 are connected by the third pipe 73. Specifically, the other side of the first heat dissipator 1A and the second cooling device 4 are connected by the third pipe 73 via the second tank 6A. The other side of the second heat dissipator 2A and the second cooling device 4 are connected by the fourth pipe 74. Specifically, the other side of the second heat dissipator 2A and the second cooling device 4 are connected by the fourth pipe 74 via the second tank 6A.

Figure 10:
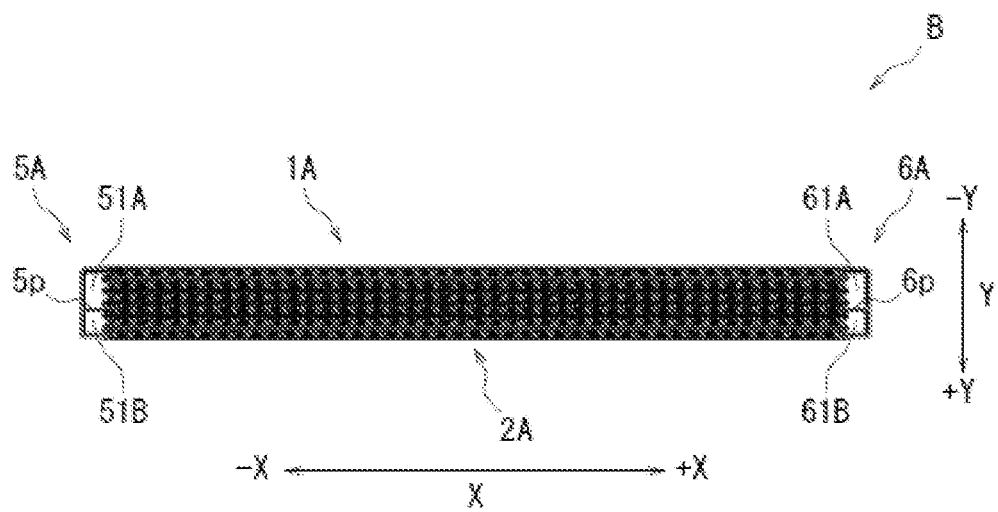
FIG. 10 is a schematic cross-sectional view of the heat dissipation device according to the second example embodiment of the present invention.

Next, the heat dissipation device B and the cooler A according to the second example embodiment of the present invention will be described with reference to FIGS. 9 and 10. FIG. 10 is a schematic cross-sectional view of the heat dissipation device B according to the second example embodiment of the present invention. In this example embodiment, the first heat dissipator 1A and the second heat dissipator 2A are arranged side by side in the second direction Y.

The first tank 5A is arranged on one side (−X direction) in the first direction X of the first heat dissipator 1A and the second heat dissipator 2A. The first tank 5A includes a first tank chamber 51A and a second tank chamber 51B. The first tank chamber 51A and the second tank chamber 51B are provided side by side in the second direction Y, and the first tank chamber 51A is positioned on one side (−Y direction) in the second direction of the second tank chamber 51B. The first tank chamber 51A is positioned on one side (−X direction) in the first direction X of the part 1Aa and the part 1Ab of the first heat dissipator 1A. The second tank chamber 51B is positioned on one side (−X direction) in the first direction X of the part 2Aa and the part 2Ab of the second heat dissipator 2A.

Similarly, the second tank 6A is arranged on the other side (+X direction) in the first direction X of the first heat dissipator 1A and the second heat dissipator 2A. The second tank 6A includes a third tank chamber 61A and a fourth tank chamber 61B. The third tank chamber 61A and the fourth tank chamber 61B are provided in the second direction Y, and the third tank chamber 61A is positioned on one side (−Y direction) in the second direction of the fourth tank chamber 61B. The third tank chamber 61A is positioned on the other side (+X direction) in the first direction X of the part 1Aa and the part 1Ab of the first heat dissipator 1A. The fourth tank chamber 61B is positioned on the other side (+X direction) in the first direction X of the part 2Aa and the part 2Ab of the second heat dissipator 2A.

Also in this example embodiment, the cooling performances of the first cooling device 3 and the second cooling device 4 can be equalized.

Figure 11A:
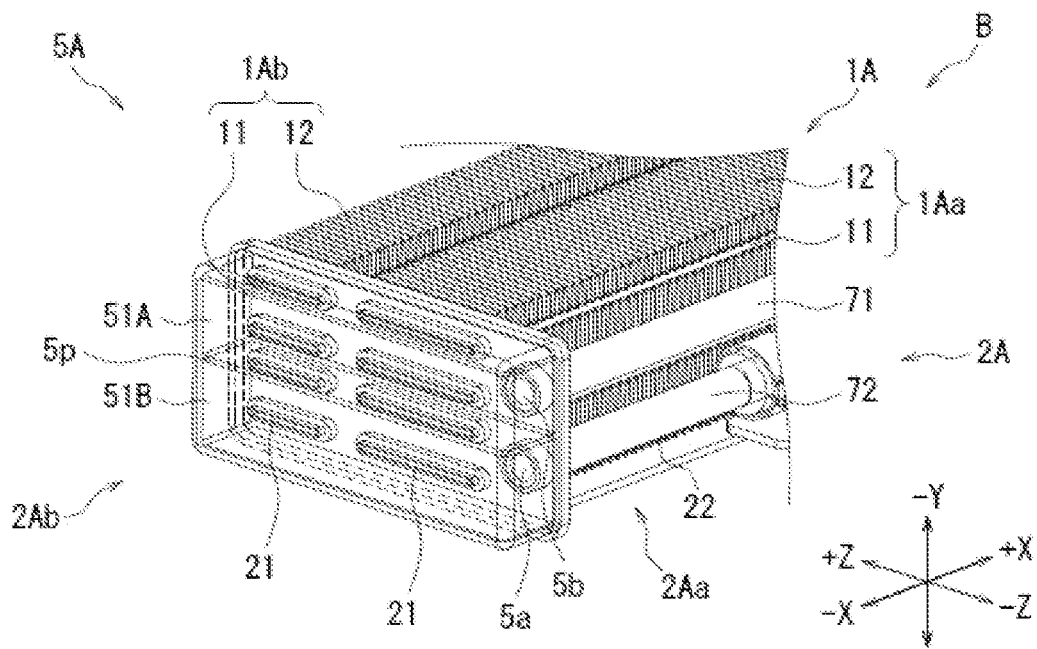
FIG. 11A is a partially transparent perspective view of the vicinity of a first tank in the heat dissipation device according to the second example embodiment of the present invention.
Figure 11B:
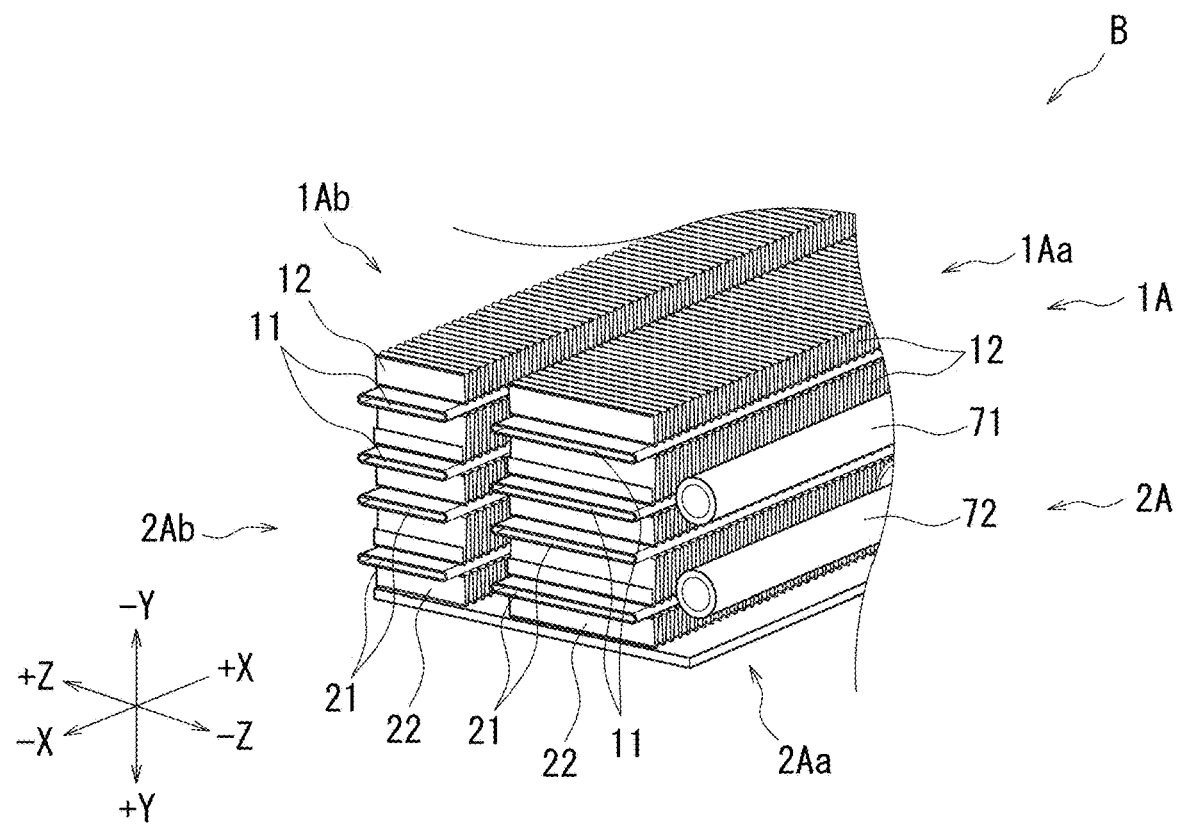
FIG. 11B is a cross-sectional perspective view of the heat dissipation device according to the second example embodiment of the present invention taken along the second direction.

Next, the heat dissipation device B according to the second example embodiment of the present invention will be described with reference to FIGS. 9 to 11B. FIG. 11A is a partially transparent perspective view of the vicinity of the first tank 5A in the heat dissipation device B according to the second example embodiment of the present invention. FIG. 11B is a cross-sectional perspective view of the heat dissipation device B according to the second example embodiment of the present invention taken along the second direction Y.

As illustrated in FIGS. 11A and 11B, the first heat dissipator 1A includes the part 1Aa and the part 1Ab. Each of the part 1Aa and the part 1Ab has the first cooling pipe 11 and the first fin 12.

The second heat dissipator 2A includes the part 2Aa and the part 2Ab. Each of the part 2Aa and the part 2Ab has the second cooling pipe 21 and the second fin 22. In the heat dissipation device B according to the second example embodiment of the present invention, the first cooling pipe 11, the first fin 12, the second cooling pipe 21, and the second fin 22 are the same as those of the heat dissipation device B according to the first example embodiment described above, and redundant description will be omitted.

As illustrated in FIG. 11A, the first tank 5A is arranged on one side (−X direction) in the first direction X of the first heat dissipator 1A and the second heat dissipator 2A. The first tank 5A is divided by the first partition 5p into the first tank chamber 51A and the second tank chamber 51B. Here, the first partition 5p extends in the third direction Z and separates the first tank 5A in the second direction Y. The first tank chamber 51A is positioned on one side (−Y direction) in the second direction, and the second tank chamber 51B is positioned on the other side (+Y direction) in the second direction. The first tank chamber 51A is connected to one side of the plurality of first cooling pipes 11 in the part 1Aa and the part 1Ab of the first heat dissipator 1A. The second tank chamber 51B is connected to one side of the plurality of the second cooling pipes 21 in the part 2Aa and the part 2Ab of the second heat dissipator 2A. The first pipe 71 is connected to the first tank chamber 51A. The second pipe 72 is connected to the second tank chamber 51B.

As illustrated in FIG. 11B, here, each of the first pipe 71 and the second pipe 72 extends in the first direction X, similarly to the first heat dissipator 1A and the second heat dissipator 2A.

Figure 12A:
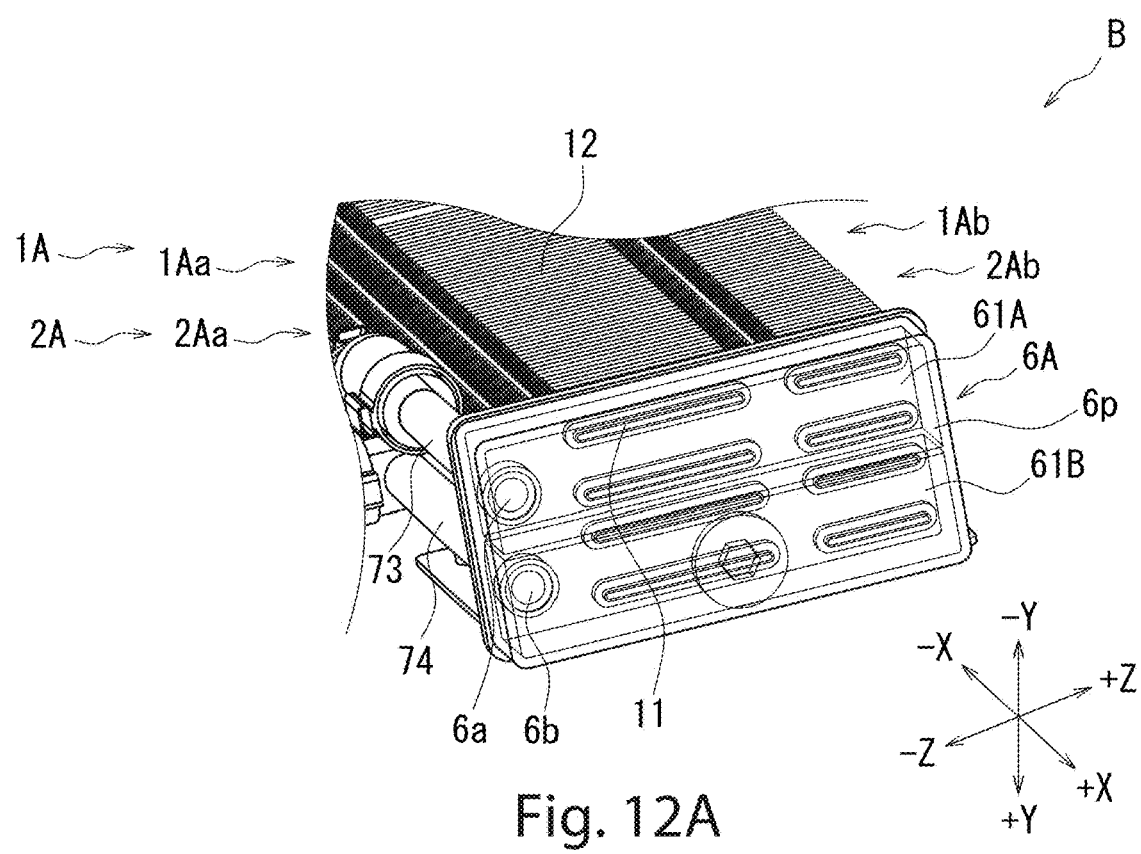
FIG. 12A is a partially transparent perspective view of the vicinity of the second tank in the heat dissipation device according to the second example embodiment of the present invention.
Figure 12B:
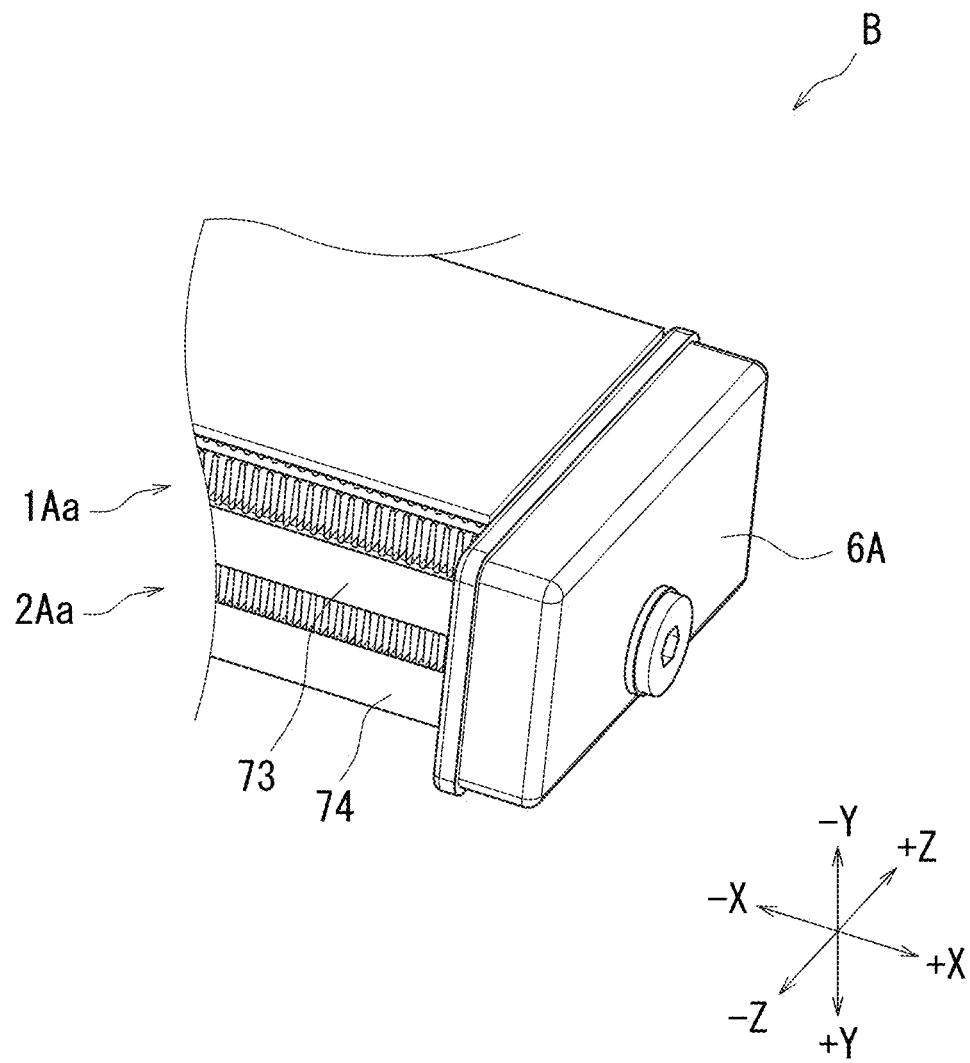
FIG. 12B is a perspective view of the vicinity of the second tank in the heat dissipation device according to the second example embodiment of the present invention.

Next, the heat dissipation device B according to the second example embodiment of the present invention will be described with reference to FIGS. 12A and 12B. FIG. 12A is a partially transparent perspective view of the vicinity of the second tank 6A in the heat dissipation device B according to the second example embodiment of the present invention. FIG. 12B is a perspective view of the vicinity of the second tank 6A in the heat dissipation device B according to the second example embodiment of the present invention. In FIG. 12B, the first heat dissipator 1A of the heat dissipation device B is covered from one side (−Y direction) in the second direction.

As illustrated in FIGS. 12A and 12B, the second tank 6A is arranged on the other side (+X direction) in the first direction X of the first heat dissipator 1A and the second heat dissipator 2A. The second tank 6A is divided by the second partition 6p into the third tank chamber 61A and the fourth tank chamber 61B. Here, the second partition 6p extends in the third direction Z and separates the second tank 6A in the second direction Y. The third tank chamber 61A is positioned on one side (−Y direction) in the second direction, and the fourth tank chamber 61B is positioned on the other side (+Y direction) in the second direction. The third tank chamber 61A is connected to the other side of the plurality of first cooling pipes 11 in the part 1Aa and the part 1Ab of the first heat dissipator 1A. The fourth tank chamber 62B is connected to the other side of the plurality of the second cooling pipes 21 in the part 2Aa and the part 2Ab of the second heat dissipator 2A. The third pipe 73 is connected to the third tank chamber 61A. The fourth pipe 74 is connected to the fourth tank chamber 61B.

As illustrated in FIG. 12B, here, each of the third pipe 73 and the fourth pipe 74 extends in the first direction X, similarly to the first heat dissipator 1A and the second heat dissipator 2A.

The first heat dissipator 1A includes the first cooling pipe 11 and the first fin 12. The first cooling pipe 11 extends in the first direction X. The coolant passes through the first cooling pipe 11. The first fin 12 is in contact with the outer peripheral surface of the first cooling pipe 11. The first fin 12 extends in the second direction Y orthogonal to the first direction X with respect to the first cooling pipe 11.

The second heat dissipator 2A includes the second cooling pipe 21 and the second fin 22. The second cooling pipe 21 extends in the first direction X. The coolant passes through the second cooling pipe 21. The second fin 22 is in contact with the outer peripheral surface of the second cooling pipe 21. The second fin 22 extends in the second direction Y.

The first heat dissipator 1A and the second heat dissipator 2A are arranged in the second direction Y. The first tank 5A is divided by the first partition 5p into the first tank chamber 51A and the second tank chamber 51B. The first tank chamber 51A is connected to the tank-side first inflow port 5b. The second tank chamber 51B is connected to the tank-side first outflow port 5a.

The second tank 6A is divided by the second partition 6p into the third tank chamber 61A and the fourth tank chamber 61B. The third tank chamber 61A is connected to the tank-side second outflow port 6a. The fourth tank chamber 61B is connected to the tank-side second inflow port 6b.

The first fin 12 extends in the Y direction from the first cooling pipe 11. The second fin 22 extends in the Y direction from the second cooling pipe 21. By arranging the first heat dissipator 1A and the second heat dissipator 2A in the direction (Y direction) in which the first fin 12 and the second fin 22 extend from the first cooling pipe 11 and the second cooling pipe 21, respectively, it is possible to easily equalize the cooling performances of the first heat dissipator 1A and the second heat dissipator 2A.

Figure 13:
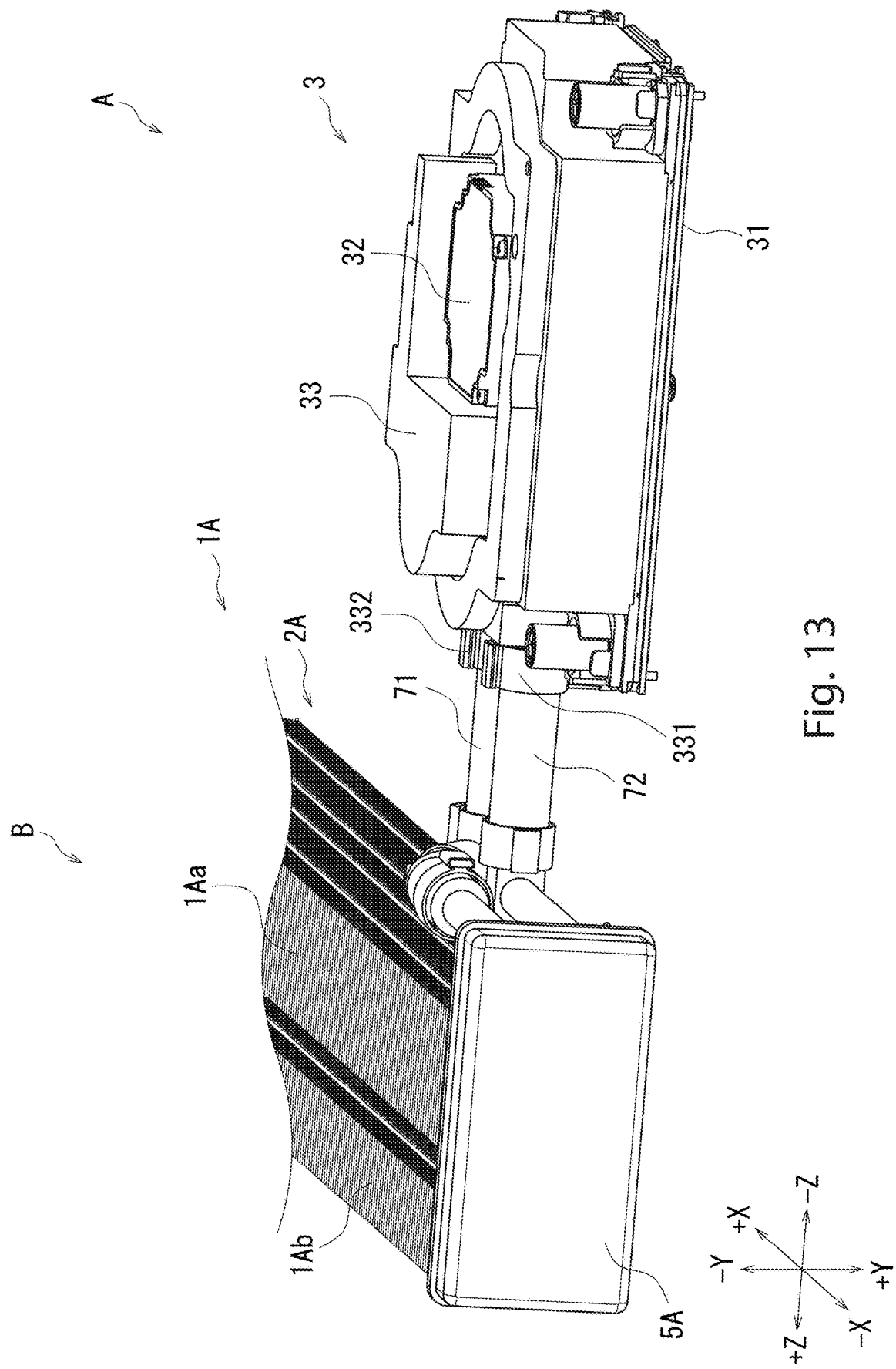
FIG. 13 is a schematic partially enlarged perspective view of a cooler according to the second example embodiment of the present invention.
Figure 14:
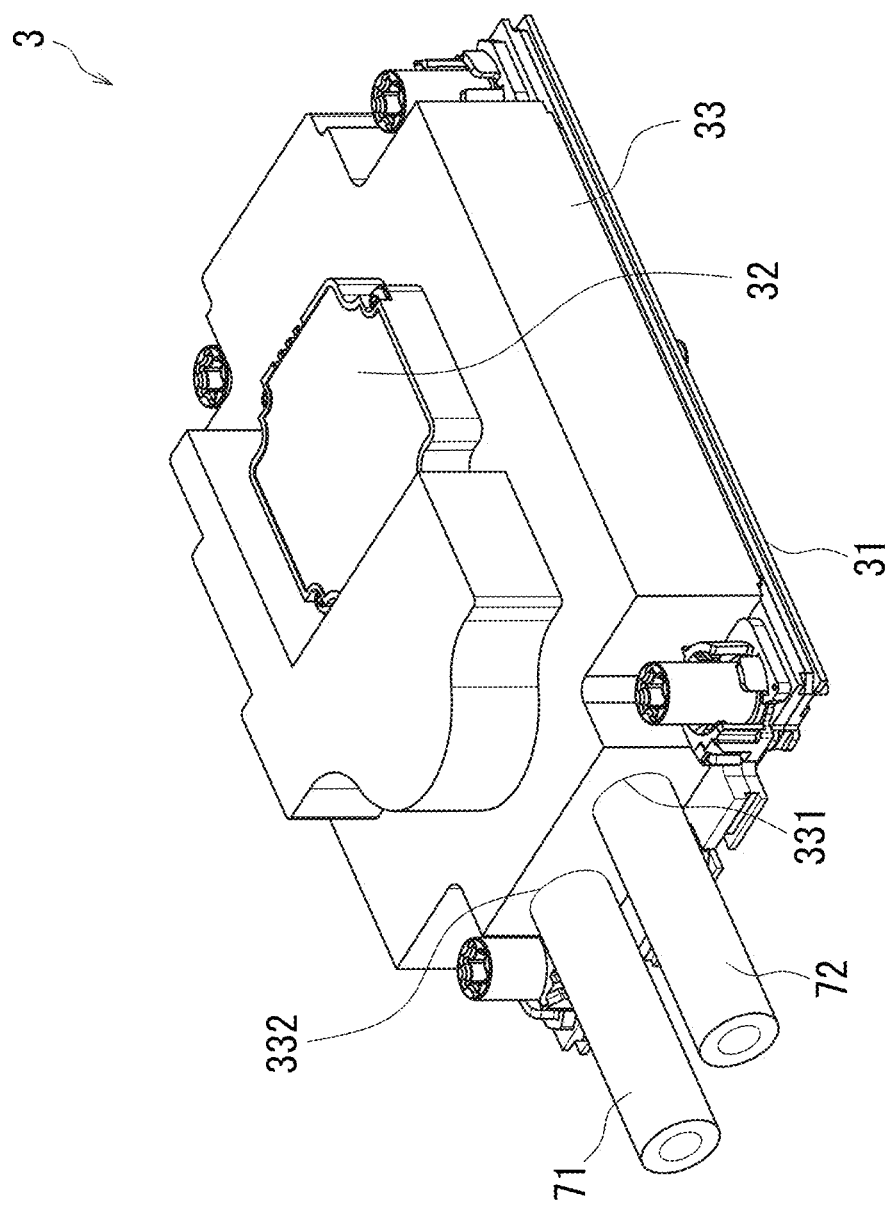
FIG. 14 is a schematic perspective view of the first cooling device in the cooler according to the second example embodiment of the present invention.

Next, the first cooling device 3 and the second cooling device 4 in the cooler A according to the second example embodiment of the present invention will be described with reference to FIGS. 13 and 14. FIG. 13 is a schematic partially enlarged perspective view of the cooler A according to the second example embodiment of the present invention. FIG. 14 is a schematic perspective view of the first cooling device 3 in the cooler A according to the second example embodiment of the present invention. Since the second cooling device 4 has the same configuration as that of the first cooling device 3, redundant description will be omitted.

As illustrated in FIGS. 13 and 14, the first cooling device 3 includes the cold plate 31, the pump 32, and the casing 33. The pump 32 is positioned on one side (−Y direction) in the second direction of the casing 33. Here, the pump 32 is positioned substantially at the center in the third direction on the surface on one side (−Y direction) in the second direction of the casing 33. The cold plate 31 is positioned on the other side (+Y direction) in the second direction of the casing 33.

In the first cooling device 3, the casing 33 has the first inflow port 331 and the first outflow port 332. The first inflow port 331 is connected to the second pipe 72. The first outflow port 332 is connected to the first pipe 71. The casing 33 has a flow path therein. In the first cooling device 3, the coolant flowing in from the first inflow port 331 flows through the flow path in the casing 33, flows through the cold plate 31 and the pump 32, and flows out from the first outflow port 332. In the first cooling device 3, the second pipe 72 connected to the first inflow port 331 and the first pipe 71 connected to the first outflow port 332 are positioned at the same height in the second direction (Y direction).

Figure 15A:
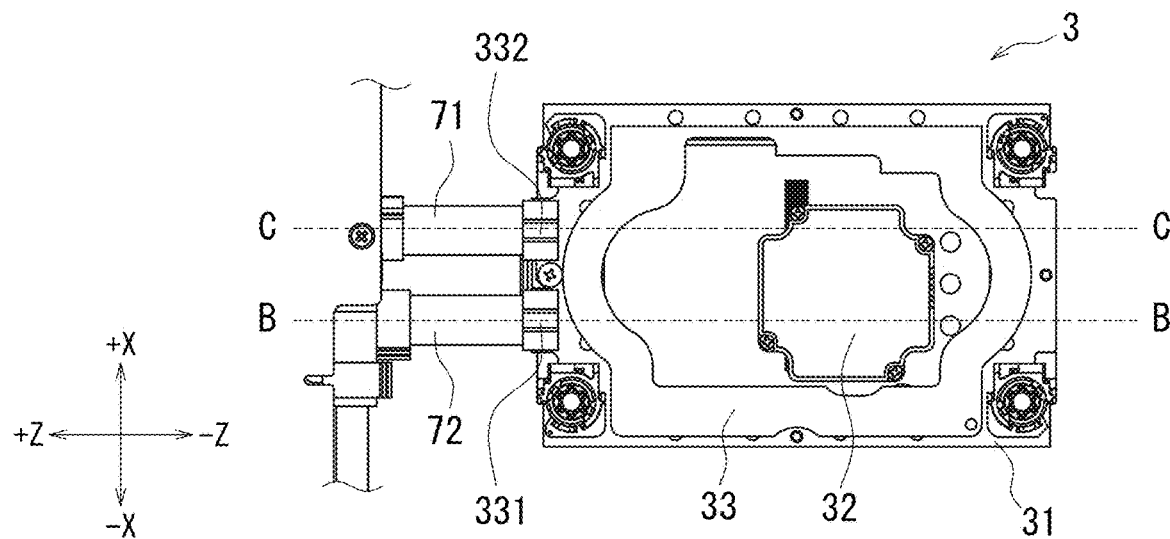
FIG. 15A is a schematic plan view of the vicinity of the first cooling device in the cooler according to the second example embodiment of the present invention.
Figure 15B:
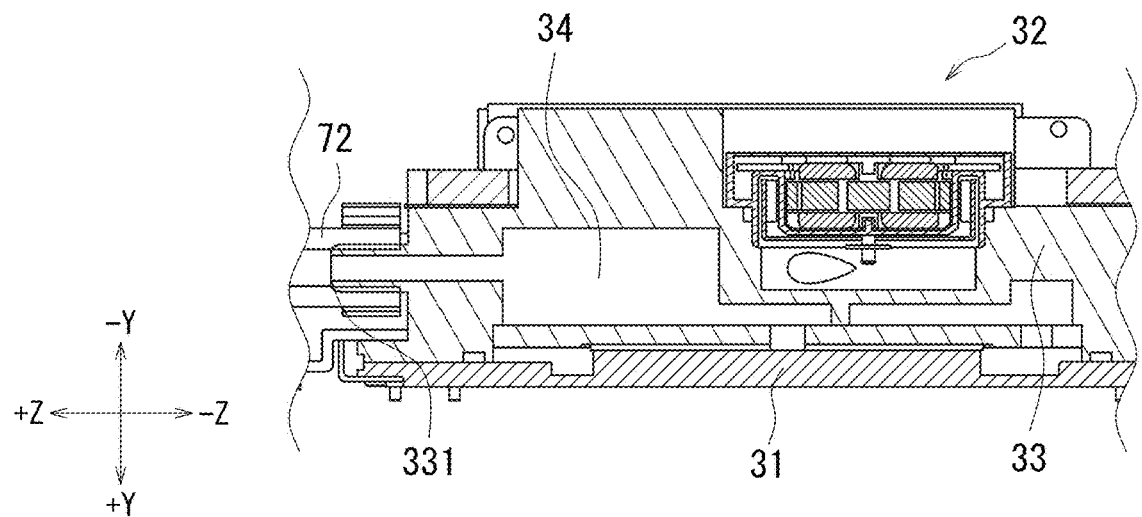
FIG. 15B is a schematic cross-sectional view taken along line B-B in FIG. 15A.
Figure 15C:
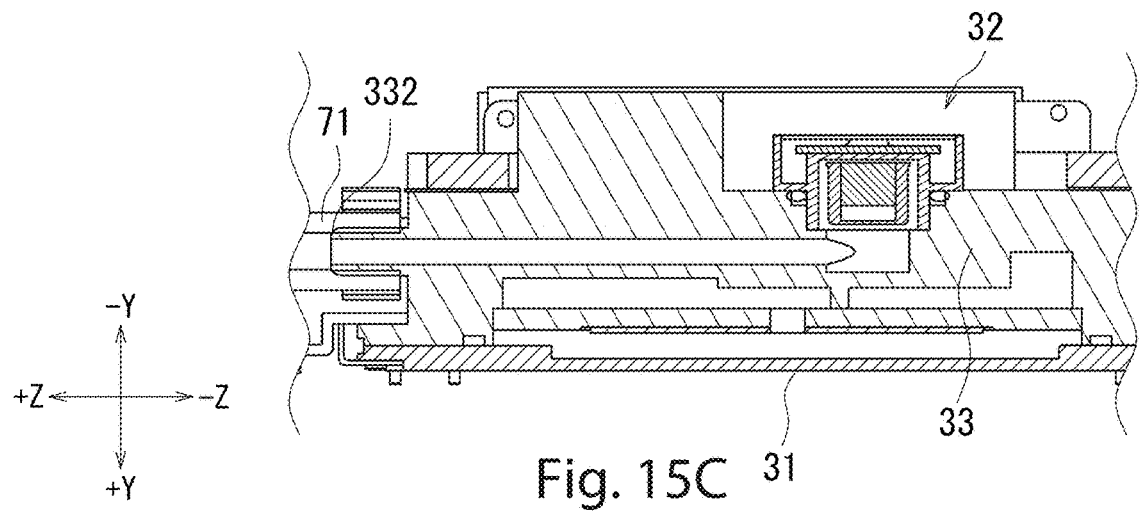
FIG. 15C is a schematic cross-sectional view taken along line C-C in FIG. 15A.

Next, the first cooling device 3 and the second cooling device 4 in the cooler A according to the second example embodiment of the present invention will be described with reference to FIGS. 15A to 15C. FIG. 15A is a schematic plan view of the first cooling device 3 in the cooler A according to the second example embodiment of the present invention. FIG. 15B is a schematic cross-sectional view taken along line B-B in FIG. 15A. FIG. 15C is a schematic cross-sectional view taken along line C-C in FIG. 15A. Also here, since the second cooling device 4 has the same configuration as that of the first cooling device 3, redundant description will be omitted.

As illustrated in FIGS. 15A to 15C, a cooling device tank chamber 34 is provided inside the casing 33. The cooling device tank chamber 34 is positioned in a flow path connecting the first inflow port 331 and the cold plate 31.

When the coolant having flowed through the second pipe 72 flows in from the first inflow port 331 of the first cooling device 3, the coolant flows into the cooling device tank chamber 34. The cross-sectional area of the cooling device tank chamber 34 is larger than the cross-sectional area of the flow path of the first inflow port 331. The coolant having passed through the cooling device tank chamber 34 flows in the other side (+Y direction) in the second direction and comes into contact with the cold plate 31. The coolant flows in one side (−Z direction) in the third direction along the cold plate 31 and reaches the other side (+Y direction) in the second direction Y of the pump 32. The coolant is sucked up by the pump 32 in one side (−Y direction) in the second direction Y, flows in a direction orthogonal to the second direction Y, and flows out from the first outflow port 332 of the first cooling device 3 through the first pipe 71.

Thus, the first cooling device 3 includes the pump 32, the casing 33, and the cooling device tank chamber 34. The cooling device tank chamber 34 is arranged inside the casing 33. The pump 32 is positioned on one side (−Y direction) in the second direction with respect to the casing 33. The pump 32 is a centrifugal pump. In the first cooling device 3, the first pipe 71 and the second pipe 72 are positioned at the same height in the second direction (Y direction).

Since the first pipe 71 through which the coolant flows out from the first cooling device 3 is positioned at the same height in the second direction (Y direction) as the second pipe 72 through which the coolant flows into the first cooling device 3, the first cooling device 3 can be thinned.

Figure 16:
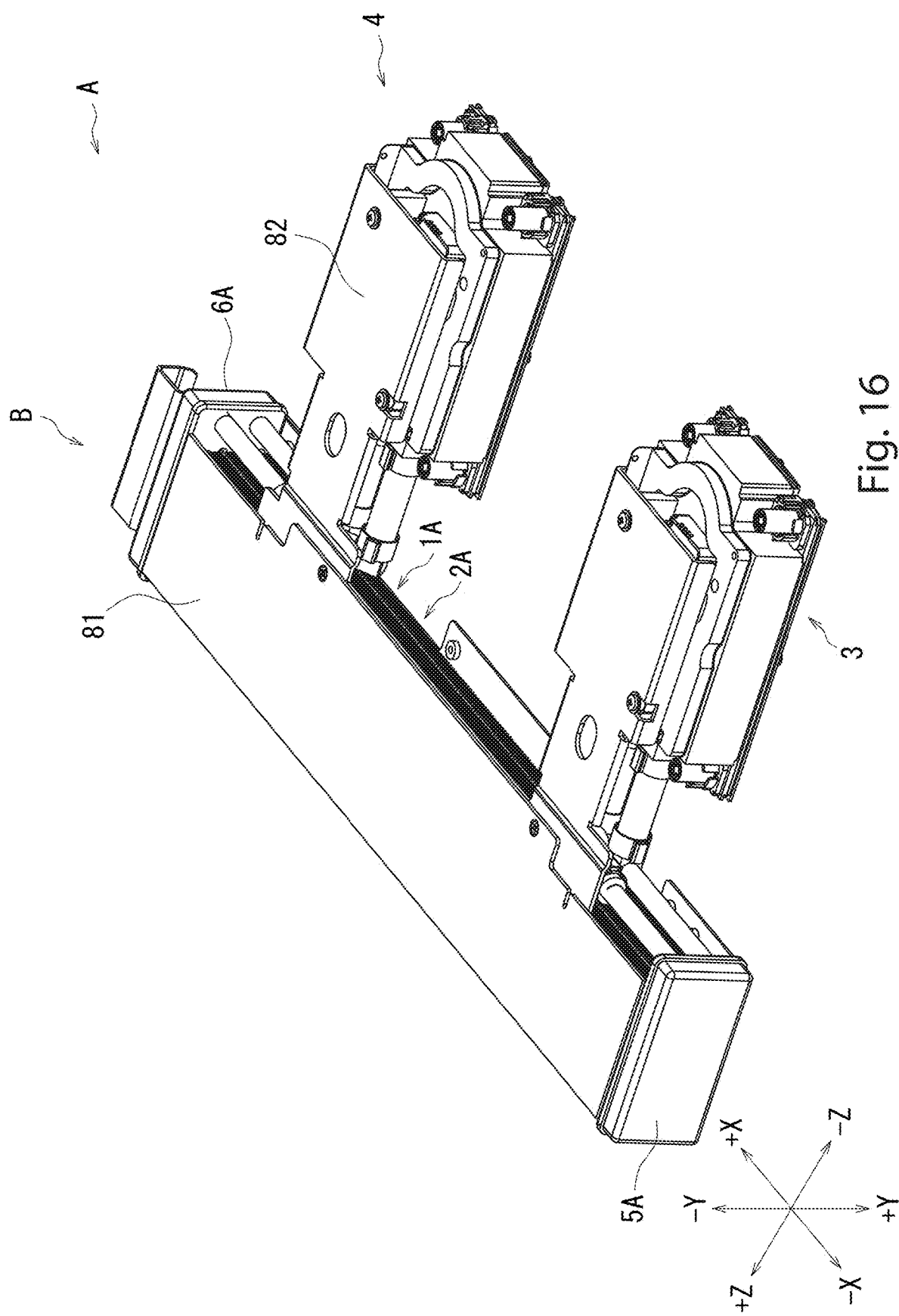
FIG. 16 is an overall perspective view of a state in which various fixing components are attached to the cooler according to the second example embodiment of the present invention.

Next, a fixing structure of the heat dissipation device B, the first cooling device 3, and the second cooling device 4 will be described with reference to FIG. 16. FIG. 16 is an overall perspective view of a state in which various fixing components are attached to the cooler A according to the second example embodiment of the present invention.

The first heat dissipator 1A and the second heat dissipator 2A are fixed to each other by a heat dissipator fixing component 81. When the first heat dissipator 1A and the second heat dissipator 2A are separate bodies, the first heat dissipator 1A and the second heat dissipator 2A are fixed to the heat dissipator fixing component 81, and the first heat dissipator 1A and the second heat dissipator 2A become easily conveyed.

The heat dissipator fixing component 81 extends in the first direction X. Here, the heat dissipator fixing component 81 covers the heat dissipation device B from both sides of one side (−Y direction) in the second direction and the other side (+Y direction) in the second direction. For example, the heat dissipator fixing component 81 is welded to the first fin 12 of the first heat dissipator 1A and the second fin 22 of the second heat dissipator 2A.

The first cooling device 3 and the second cooling device 4 are fixed to the heat dissipator by a cooling device fixing component 82 connected to the heat dissipator fixing component 81. For example, the cooling device fixing component 82 is a plate member made of metal having excellent thermal conductivity such as copper or aluminum.

The cooling device fixing component 82 fixes the first cooling device 3 to the heat dissipator fixing component 81. The cooling device fixing component 82 extends from the heat dissipator fixing component 81 to one side (−Z direction) in the third direction and supports the first cooling device 3 from one side (−Y direction) in the second direction. Similarly, the cooling device fixing component 82 fixes the second cooling device 4 to the heat dissipator fixing component 81. The cooling device fixing component 82 extends from the heat dissipator fixing component 81 to one side (−Z direction) in the third direction and supports the second cooling device 4 from one side (−Y direction) in the second direction.

The cooling device fixing component 82 facilitates conveyance of the first heat dissipator 1A, the second heat dissipator 2A, the first cooling device 3, and the second cooling device 4, which are separate components. The relative position of each component can be determined. For example, the cooling device fixing component 82 is a plate member made of metal having excellent thermal conductivity such as copper or aluminum.

The cooling device fixing component 82 is arranged at a position in contact with the surface on the other side (+Y direction) in the second direction of the heat dissipator fixing component 81, and the cooling device fixing component 82 and the heat dissipator fixing component 81 are fixed to each other. Due to this, when the length of the cooler A in the second direction Y is determined, the position of the heat dissipator fixing component 81 is determined based on the lengths of the first heat dissipator 1A and the second heat dissipator 2A in the second direction Y, and therefore the lengths of the first heat dissipator 1A and the second heat dissipator 2A in the second direction Y can be maximized to the limit.

Thus, the cooler A further includes the heat dissipator fixing component 81 that fixes the first heat dissipator 1A and the second heat dissipator 2A. Since the heat dissipator fixing component 81 can fix the first heat dissipator 1A and the second heat dissipator 2A, which are separate components, the first heat dissipator 1A and the second heat dissipator 2A can be easily conveyed.

The cooler A further includes the cooling device fixing component 82 that fixes the first cooling device 3 and the second cooling device 4 to the heat dissipator fixing component 81. Since the cooling device fixing component 82 can integrally fix the first heat dissipator 1A, the second heat dissipator 2A, the first cooling device 3, and the second cooling device 4, which are separate components, the cooler A can be easily conveyed.

While the aspect in which the cooler A of the second example embodiment includes the heat dissipator fixing component 81 and the cooling device fixing component 82 has been described with reference to FIG. 16, it goes without saying that the cooler A of the first example embodiment may include the heat dissipator fixing component 81 and the cooling device fixing component 82. In this case, the heat dissipator fixing component 81 may support the first heat dissipator 1 and the second heat dissipator 2 of the heat dissipation device B from at least one of one side (−Y direction) in the second direction and the other side (+Y direction) in the second direction.

In the heat dissipation device B illustrated in FIGS. 9, 11A, 11B, and 13, the first heat dissipator 1A and the second heat dissipator 2A are stacked in the second direction Y, the first heat dissipator 1A is separated into the part 1Aa and the part 1Ab, which is positioned on the other side (+Z direction) in the third direction Z with respect to the part 1Aa, and the second heat dissipator 2A is separated into the part 2Aa and the part 2Ab, which is positioned on the other side (+Z direction) in the third direction Z with respect to the part 2Aa. However, the present example embodiment is not limited to this. The first heat dissipator 1A needs not be separated into the part 1Aa and the part 1Ab, and the second heat dissipator 2A needs not be separated into the part 2Aa and the part 2Ab.

Next, the heat dissipation device B according to the second example embodiment of the present invention will be described with reference to FIG. 17. FIG. 17 is a cross-sectional perspective view of the heat dissipation device B according to the second example embodiment of the present invention taken along the second direction Y.

As illustrated in FIG. 17, the first heat dissipator 1A extends in the first direction X. The first heat dissipator 1A includes the plurality of first cooling pipes 11 and the plurality of first fins 12. The second heat dissipator 2A includes the plurality of second cooling pipes 21 and the plurality of second fins 22. Also here, the first heat dissipator 1A and the second heat dissipator 2A are also arranged in the second direction Y. For example, the first heat dissipator 1A and the second heat dissipator 2A are stacked in the second direction Y. In this manner, the first heat dissipator 1A and the second heat dissipator 2A may be stacked in the second direction Y without being separated in the third direction Z.

The example embodiments of the present invention have been described with reference to the drawings. However, the above example embodiments are merely examples of the present invention, and the present invention is not limited to the above example embodiments, and can be implemented in various aspects without departing from the gist thereof. For easy understanding, the drawings schematically illustrate each constituent element as the subject, and the thickness, length, number, and the like of each illustrated constituent element are different from actual ones for convenience of drawing. Additionally, the material, shape, dimension, and the like of each constituent element illustrated in the above example embodiments are mere examples and are not particularly limited, and various modifications can be made without substantially departing from the effects of the present invention. The configuration of the example embodiments may be appropriately changed without departing from the technical idea of the present invention. Example embodiments may also be implemented in combination as far as possible.

For example, in the cooler A illustrated in FIG. 2, the first heat generating component R1 and the second heat generating component R2 are separated, but the present example embodiment is not limited to this. The first heat generating component R1 and the second heat generating component R2 may be different components in an integrally configured single device.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A heat dissipation device that allows a coolant to flow into and out of a first cooling device and a second cooling device, the heat dissipation device comprising:
   a first heat dissipator;
   a second heat dissipator;
   a first tank connected to one side of each of the first heat dissipator and the second heat dissipator in a first direction; and a second tank connected to another side of each of the first heat dissipator and the second heat dissipator in the first direction; wherein the coolant flows through an inside of the first heat dissipator, the second heat dissipator, the first tank, and the second tank;

the first tank includes a tank-side first outflow port through which the coolant flows out to the first cooling device, and a tank-side first inflow port through which the coolant from the first cooling device flows in;

the second tank includes a tank-side second outflow port through which the coolant flows out to the second cooling device, and a tank-side second inflow port through which the coolant from the second cooling device flows in;

in the first heat dissipator, a coolant flowing in from the tank-side first inflow port flows from one side in the first direction to another side in the first direction and flows out from the tank-side second outflow port; and in the second heat dissipator, a coolant flowing in from the tank-side second inflow port flows from another side in the first direction to one side in the first direction and flows out from the tank-side first outflow port.

2. The heat dissipation device according to claim 1, wherein the first heat dissipator includes:
a first cooling pipe through which the coolant passes, the first cooling pipe extending in the first direction; and
a first fin that is in contact with an outer peripheral surface of the first cooling pipe and extends in a second direction orthogonal to the first direction;

the second heat dissipator includes:
a second cooling pipe through which the coolant passes, the second cooling pipe extending in the first direction; and
a second fin that is in contact with an outer peripheral surface of the second cooling pipe and extends in the second direction;

the first heat dissipator and the second heat dissipator are arranged in the second direction;

the first tank is divided by a first partition into a first tank chamber connected to the tank-side first inflow port and a second tank chamber connected to the tank-side first outflow port; and the second tank is divided by a second partition into a third tank chamber connected to the tank-side second outflow port and a fourth tank chamber connected to the tank-side second inflow port.

3. The heat dissipation device according to claim 1, wherein the first heat dissipator includes:
a first cooling pipe through which the coolant passes, the first cooling pipe extending in a first direction; and
a first fin that is in contact with an outer peripheral surface of the first cooling pipe and extends in a second direction orthogonal to a first direction;

the second heat dissipator includes:
a second cooling pipe through which the coolant passes, the second cooling pipe extending in a first direction; and
a second fin that is in contact with an outer peripheral surface of the second cooling pipe and extends in the second direction;

the first heat dissipator and the second heat dissipator are arranged in a third direction orthogonal to the first direction and the second direction;

the first tank is divided by a first partition into a first tank chamber connected to the tank-side first inflow port, and a second tank chamber connected to the tank-side first outflow port; and the second tank is divided by a second partition into a third tank chamber connected to the tank-side second outflow port and a fourth tank chamber connected to the tank-side second inflow port.

4. The heat dissipation device according to claim 3, wherein when cut surfaces defined by cutting the first heat dissipator and the second heat dissipator along the second direction are viewed from the first direction, a cross-sectional area of the first heat dissipator is larger than a cross-sectional area of the second heat dissipator.

5. A cooler comprising:
the heat dissipation device according to claim 2;
the first cooling device; and
the second cooling device; wherein
the second heat dissipator and the first heat dissipator are spaced apart from the first cooling device or the second cooling device in a third direction orthogonal to the first direction and the second direction.

6. The cooler according to claim 5, further comprising:
a first pipe that connects the first tank chamber and the first cooling device;
a second pipe that connects the second tank chamber and the first cooling device;
a third pipe that connects the third tank chamber and the second cooling device; and
a fourth pipe that connects the fourth tank chamber and the second cooling device.

7. The cooler according to claim 6, wherein
the second pipe is connected to the second tank chamber; and the fourth pipe is connected to the fourth tank chamber.

8. The cooler according to claim 7, wherein
the first cooling device includes:
a casing; and
a centrifugal pump positioned on one side in the second direction with respect to the casing; and
in the first cooling device, the first pipe is positioned on one side in the first direction relative to the second pipe.

9. The cooler according to claim 7, wherein
the first cooling device includes:
a casing;
a cooling device tank chamber inside the casing; and
a centrifugal pump positioned on one side in the second direction with respect to the casing; and
in the first cooling device, the first pipe and the second pipe are positioned at a same height in the second direction.

10. The cooler according to claim 5, further comprising:
a heat dissipator fixing component that fixes the first heat dissipator and the second heat dissipator.

11. The cooler according to claim 10, further comprising:
a cooling device fixing component that fixes the first cooling device and the second cooling device to the heat dissipator fixing component.

12. A cooler comprising:
the heat dissipation device according to claim 3;
the first cooling device; and
the second cooling device; wherein the second heat dissipator, the first heat dissipator, and the first cooling device or the second cooling device are arranged in this order in a third direction orthogonal to the first direction and the second direction.

13. The cooler according to claim 12, further comprising:
a first pipe that connects the first tank chamber and the first cooling device;
a second pipe that connects the second tank chamber and the first cooling device;
a third pipe that connects the third tank chamber and the second cooling device; and
a fourth pipe that connects the fourth tank chamber and the second cooling device.

14. The cooler according to claim 13, wherein
the second pipe passes through the first tank chamber, penetrates the first partition, and is connected to the second tank chamber; and
the fourth pipe passes through the third tank chamber, penetrates the second partition, and is connected to the fourth tank chamber.

15. The cooler according to claim 14, wherein
the first cooling device includes:
a casing; and
a centrifugal pump positioned on one side in the second direction with respect to the casing; and
in the first cooling device, the first pipe is positioned on one side in the second direction relative to the second pipe.

16. The cooler according to claim 14, wherein
the first cooling device includes:
a casing;
a cooling device tank chamber inside the casing; and
a centrifugal pump positioned on one side in the second direction with respect to the casing; and
in the first cooling device, the first pipe and the second pipe are positioned at a same height in the second direction.

\* \* \* \* \*